US005789817A

United States Patent [19]
Richards et al.

[11] Patent Number: 5,789,817
[45] Date of Patent: *Aug. 4, 1998

[54] ELECTRICAL APPARATUS WITH A METALLIC LAYER COUPLED TO A LOWER REGION OF A SUBSTRATE AND A METALLIC LAYER COUPLED TO A LOWER REGION OF A SEMICONDUCTOR DEVICE

[75] Inventors: John Gareth Richards; Hector Flores. both of San Jose; Wendell B. Sander. Los Gatos, all of Calif.

[73] Assignee: Chipscale, Inc., San Jose, Calif.

[ * ] Notice: The term of this patent shall not extend beyond the expiration date of Pat. No. 5,280,194.

[21] Appl. No.: 749,422

[22] Filed: Nov. 15, 1996

Related U.S. Application Data

[63] Continuation of Ser. No. 431,990, May 1, 1995, abandoned, which is a continuation of Ser. No. 146,699, Nov. 2, 1993, abandoned, which is a continuation of Ser. No. 940,763, Sep. 4, 1992, Pat. No. 5,280,194, which is a continuation of Ser. No. 507,397, Apr. 10, 1990, abandoned, which is a continuation-in-part of Ser. No. 275,067, Nov. 21, 1988, abandoned.

[51] Int. Cl.⁶ .......................... H01L 29/41; H01L 29/868; H01L 23/15
[52] U.S. Cl. .......................... 257/724; 257/725; 257/728
[58] Field of Search .................................. 257/724, 725, 257/728

[56] References Cited

U.S. PATENT DOCUMENTS

| 3,200,311 | 8/1965 | Thomas et al. |
|---|---|---|
| 3,462,655 | 8/1969 | Coblenz . |
| 3,559,282 | 2/1971 | Lesk . |
| 3,566,214 | 2/1971 | Usuda . |
| 3,590,479 | 7/1971 | Devries .................................. 257/536 |
| 3,594,619 | 7/1971 | Kamoshida . |
| 3,602,982 | 9/1971 | Kooi . |

(List continued on next page.)

FOREIGN PATENT DOCUMENTS

| 0029334 | 5/1981 | European Pat. Off. . |
|---|---|---|
| 0057135 | 8/1982 | European Pat. Off. . |
| 54-136176 | 10/1979 | Japan . |
| 56-148848 | 11/1981 | Japan . |
| 63-047972 | 2/1988 | Japan . |
| 63-288062 | 11/1988 | Japan . |
| 2067354 | 7/1981 | United Kingdom . |
| 90/ 05997 | 5/1990 | WIPO . |
| 90/ 015438 | 12/1990 | WIPO . |

OTHER PUBLICATIONS

White, J.F., *Microwave Semiconductor Engineering,* Van Nostrand Reinhold Company Inc., pp. vii–xvii, 39–115, 364–369 (1982).

—Thomas S. Laverghetta, "Solid–State Microwave Devices," pp. 1–117, 178–88 (Artech House Inc. 1987).

(List continued on next page.)

*Primary Examiner*—Jerome Jackson
*Attorney, Agent, or Firm*—Blakely, Sokoloff, Taylor & Zafman

[57] ABSTRACT

An electrical apparatus having a first substrate, a first metallic layer, a semiconductor device, a second metallic layer, and a metallic interconnecting structure is described. The first substrate is of a semiconductor material and has an upper region and a lower region. The substrate provides an electrical path between the upper region and the lower region. The first metallic layer is coupled to the lower region of the substrate. The first metallic layer provides a first external electrical connection. The semiconductor device has an upper region and a lower region. The second metallic layer is coupled to the lower region of the semiconductor device. The second metallic layer provides a second external electrical connection. The metallic interconnecting structure electrically couples the upper region of the first substrate to the upper region of the semiconductor device. A bridge apparatus is also described. In addition, a method of fabricating an electrical apparatus is described.

15 Claims, 20 Drawing Sheets

U.S. PATENT DOCUMENTS

| | | |
|---|---|---|
| 3,666,588 | 5/1972 | Wanesky . |
| 3,680,205 | 8/1972 | Kravitz . |
| 3,686,748 | 8/1972 | Engeler et al. . |
| 3,746,945 | 7/1973 | Normington . |
| 3,748,546 | 7/1973 | Allison . |
| 3,754,169 | 8/1973 | Lyon et al. . |
| 3,761,782 | 9/1973 | Youmans . |
| 3,808,470 | 4/1974 | Kniepkamp . |
| 3,820,235 | 6/1974 | Goldman . |
| 3,886,578 | 5/1975 | Eastwood et al. . |
| 3,905,094 | 9/1975 | Ruggiero . |
| 3,944,447 | 3/1976 | Magdo et al. . |
| 4,063,176 | 12/1977 | Milligan et al. . |
| 4,250,520 | 2/1981 | Denlinger . |
| 4,278,985 | 7/1981 | Stobbs . |
| 4,577,213 | 3/1986 | Bauhahn . |
| 4,733,290 | 3/1988 | Reardon et al. . |
| 4,738,933 | 4/1988 | Richards . |
| 4,780,424 | 10/1988 | Holler et al. . |
| 4,811,080 | 3/1989 | Richards . |
| 4,855,796 | 8/1989 | Wong et al. . |
| 4,859,629 | 8/1989 | Reardon et al. . |
| 4,866,499 | 9/1989 | Aktik . |
| 4,905,071 | 2/1990 | Chalifour et al. . |
| 5,024,966 | 6/1991 | Dietrich et al. . |
| 5,034,801 | 7/1991 | Fischer . |
| 5,045,503 | 9/1991 | Kobiki et al. . |
| 5,117,280 | 5/1992 | Adachi . |
| 5,162,258 | 11/1992 | Lemnois et al. . |

OTHER PUBLICATIONS

–Joseph F. White, Ph.D., "Microwave Semiconductor Engineering," pp. vii–xvii, (Van Nostrand Reinhopld Company Inc. 1982).

–Metalics advertisement, p. 262 of "Microwaves & RF," vol. 27, No. 5 (May 1988).

–M–Pulse Microwave ad, pp. 8–9 of "Microwaves & RF," vol. 27, No. 5 (May 1988).

–M–Pulse Microwave brochure "Microwave Schouttky Diodes," May 1988.

–M–Pulse Microwave brchure "Zero Bias Schottky Diodes," May 1988.

–M–Pulse Microwave brochure "Outline Dimensions," May 1988.

–M–Pulse Microwave brochure "PIN Diodes," May 1988.

–M–Pulse Microwave brochure "Hybrid Schottky Barrier Diodes," May 1988.

–M–Pulse Microwave brochure "Step Recovery Diodes," May 1988.

–M–Pulse Microwave brochure "Microwave Tunnel Diodes," May 1988.

–M–Pulse Microwave brochure "MNOS Chip Capacitors," May 1988.

–M–Pulse Microwave brochure "Techniques for Hybrid Assembly," (Application Note 220). May 1988.

–Robert Boylestad and Louis Nashelsky, "Electronic Devices and Circuit Theory," pp. v–xi, 1–65, 82–87, 145–47, 462–88 (Prentice–Hall, Inc. 3rd Edition 1982).

–W.A. Gambling, "Microwave Semiconductor Devices," Electronic Engineering Series, pp. 105–108 (1972).

–W.J. Garceau and G.K. Herb, "Modified Beam Load Magnetics for Handling Semiconductors," Western Electric Technical Digest, No. 51, pp. 11–12 (Jul. 1978).

FIG_1 (PRIOR ART)
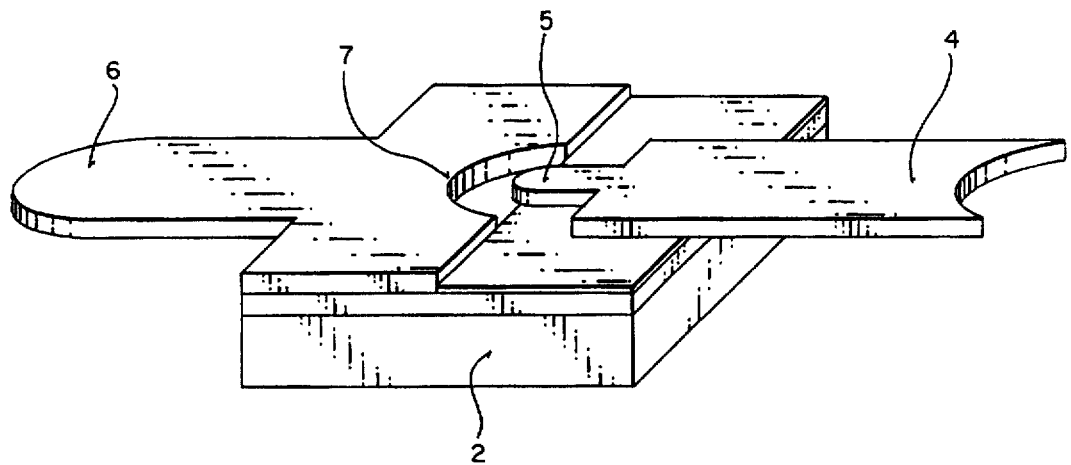
FIG_2 (PRIOR ART)
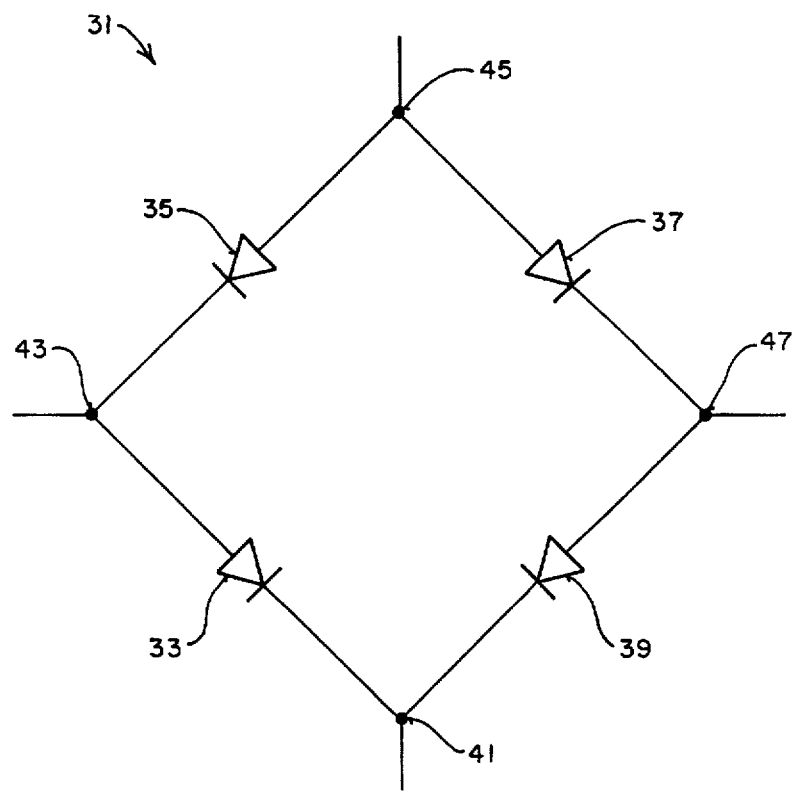

FIG_3 (PRIOR ART)
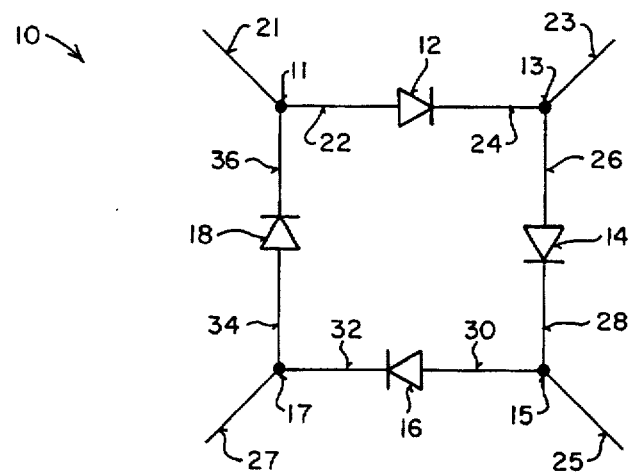
FIG_4 (PRIOR ART)
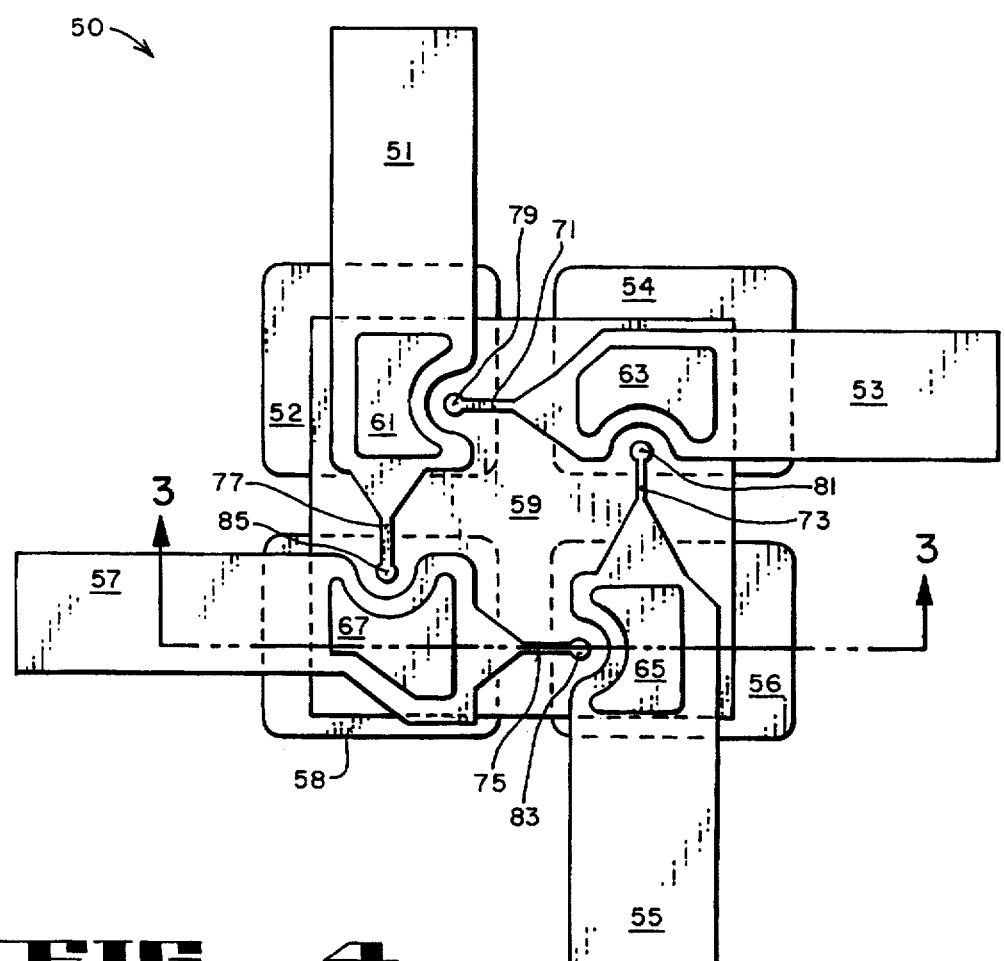

FIG_5 (PRIOR ART)
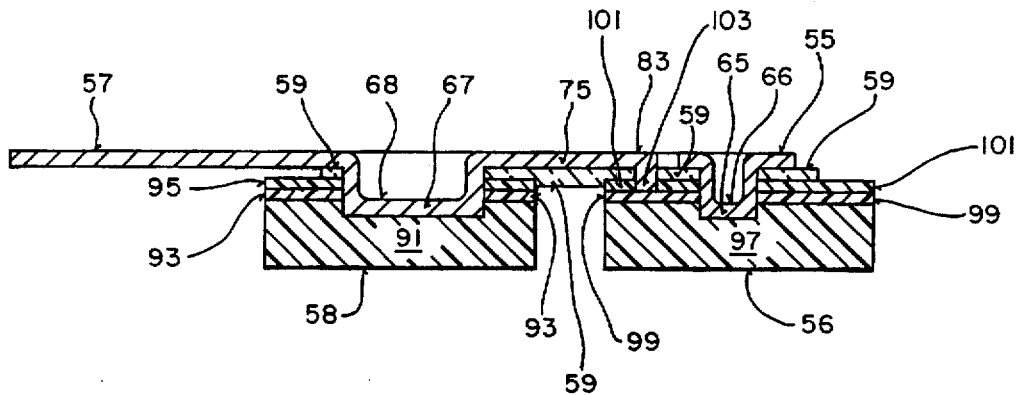
FIG_6 (PRIOR ART)
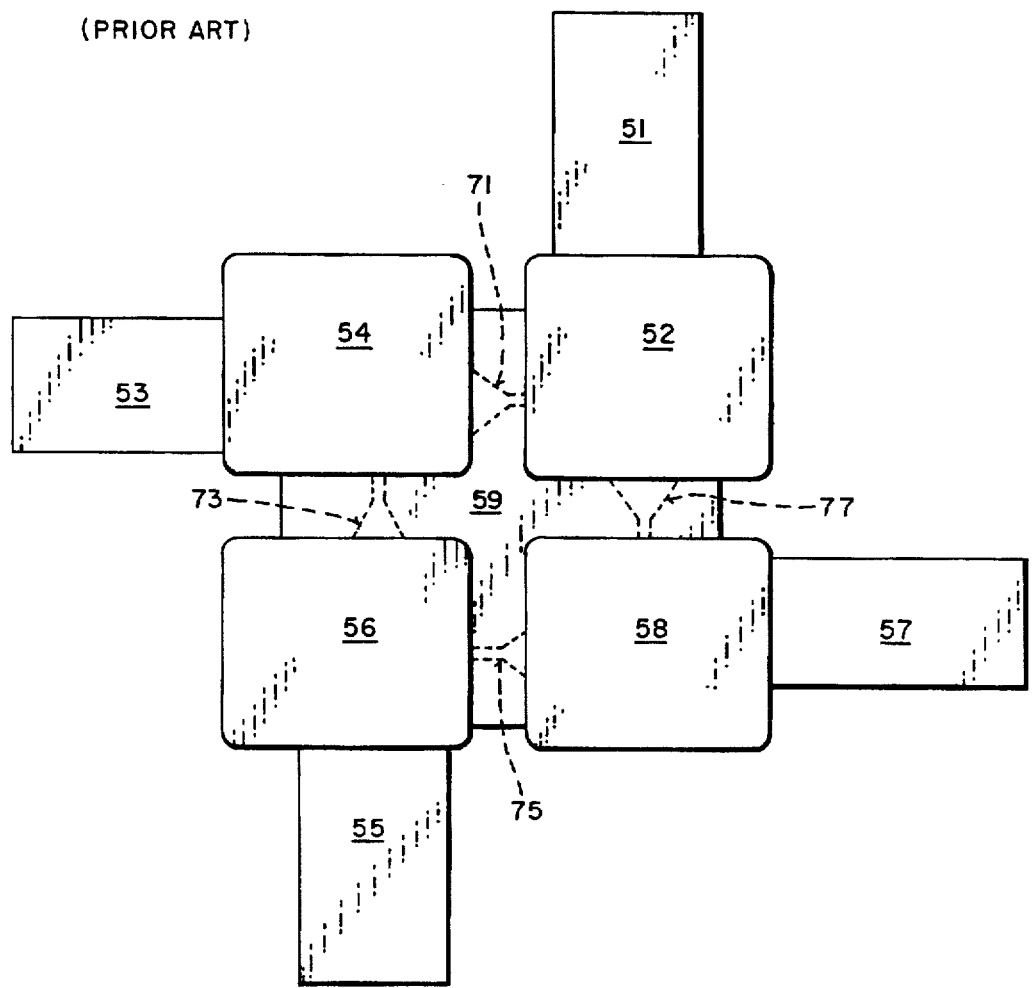

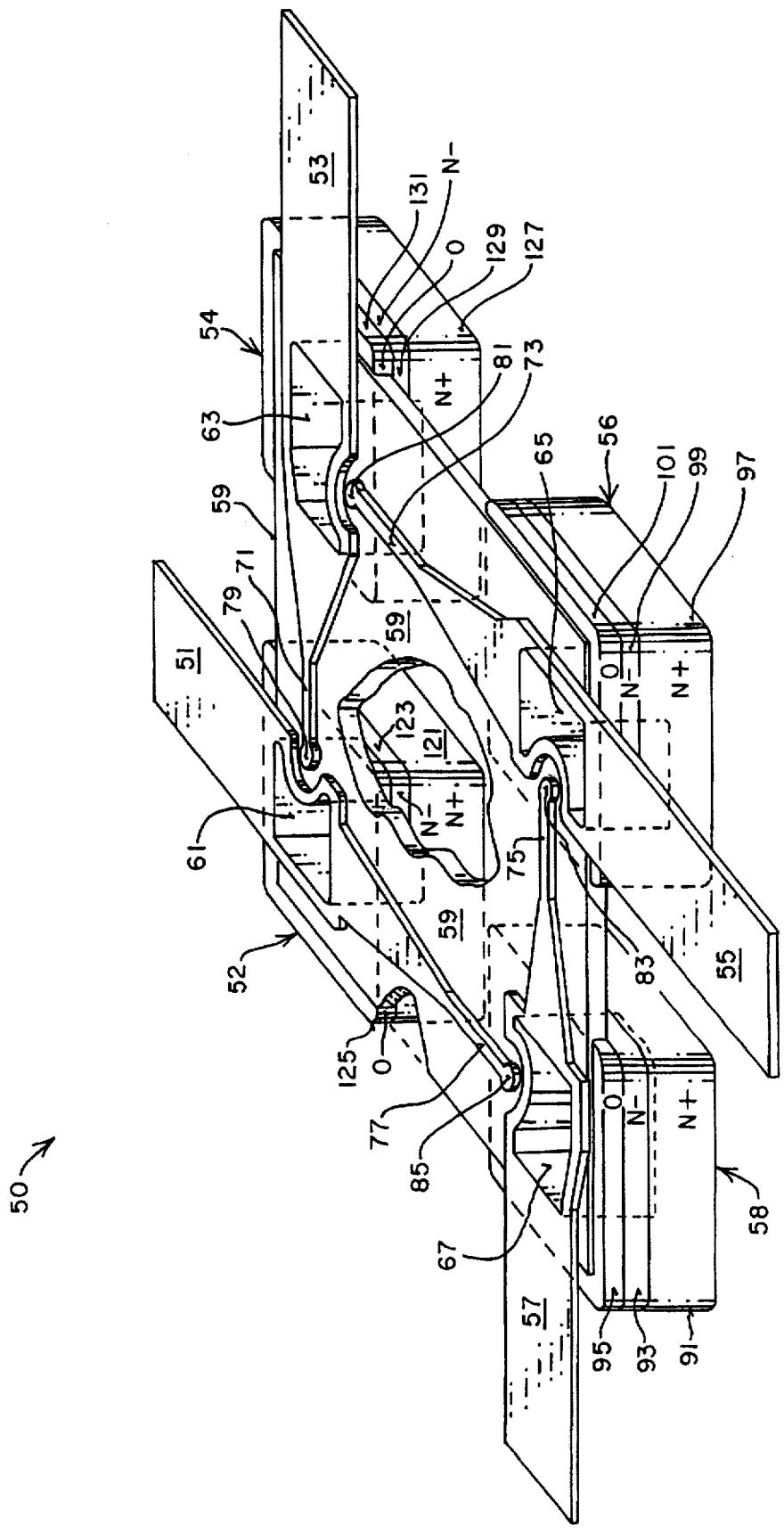

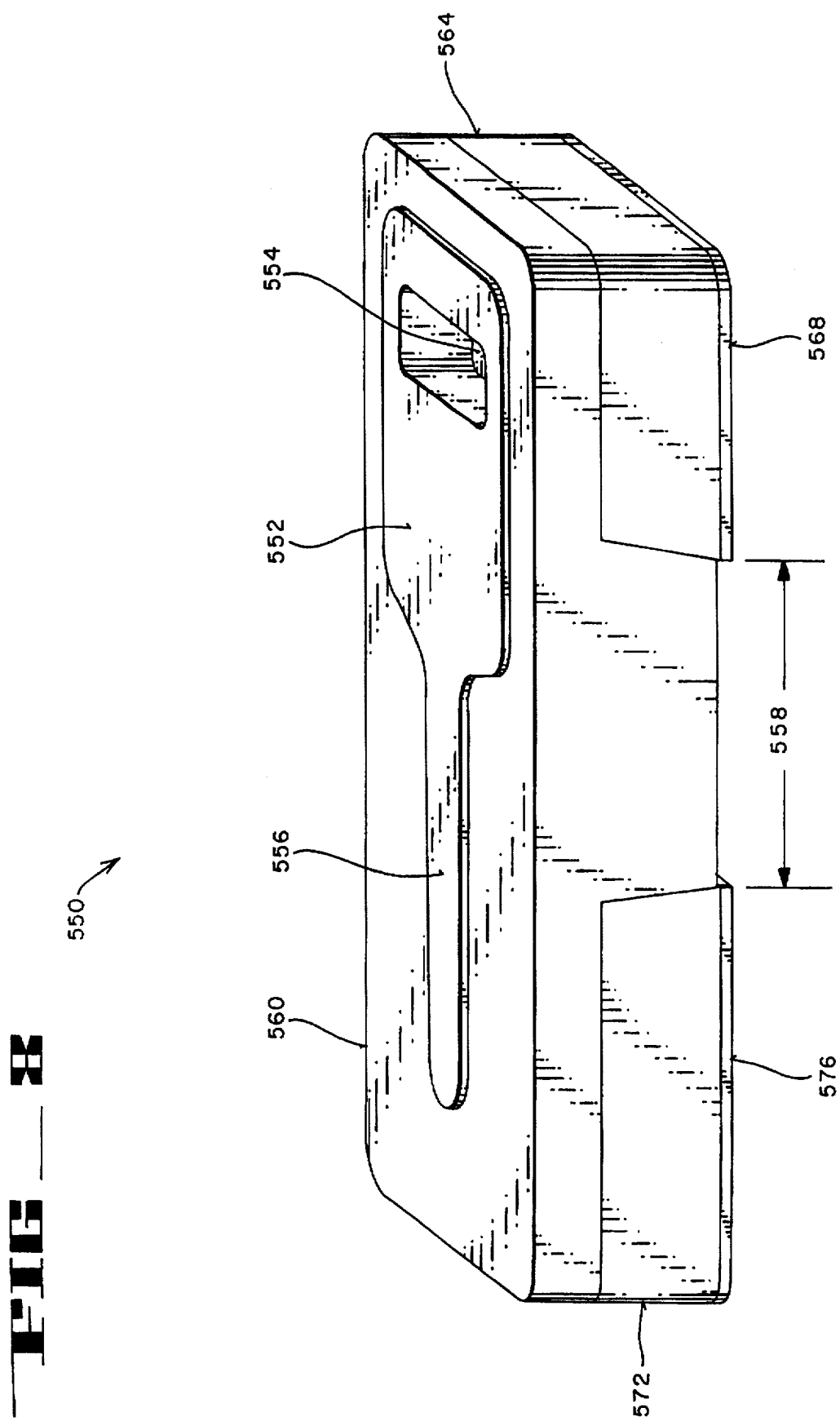

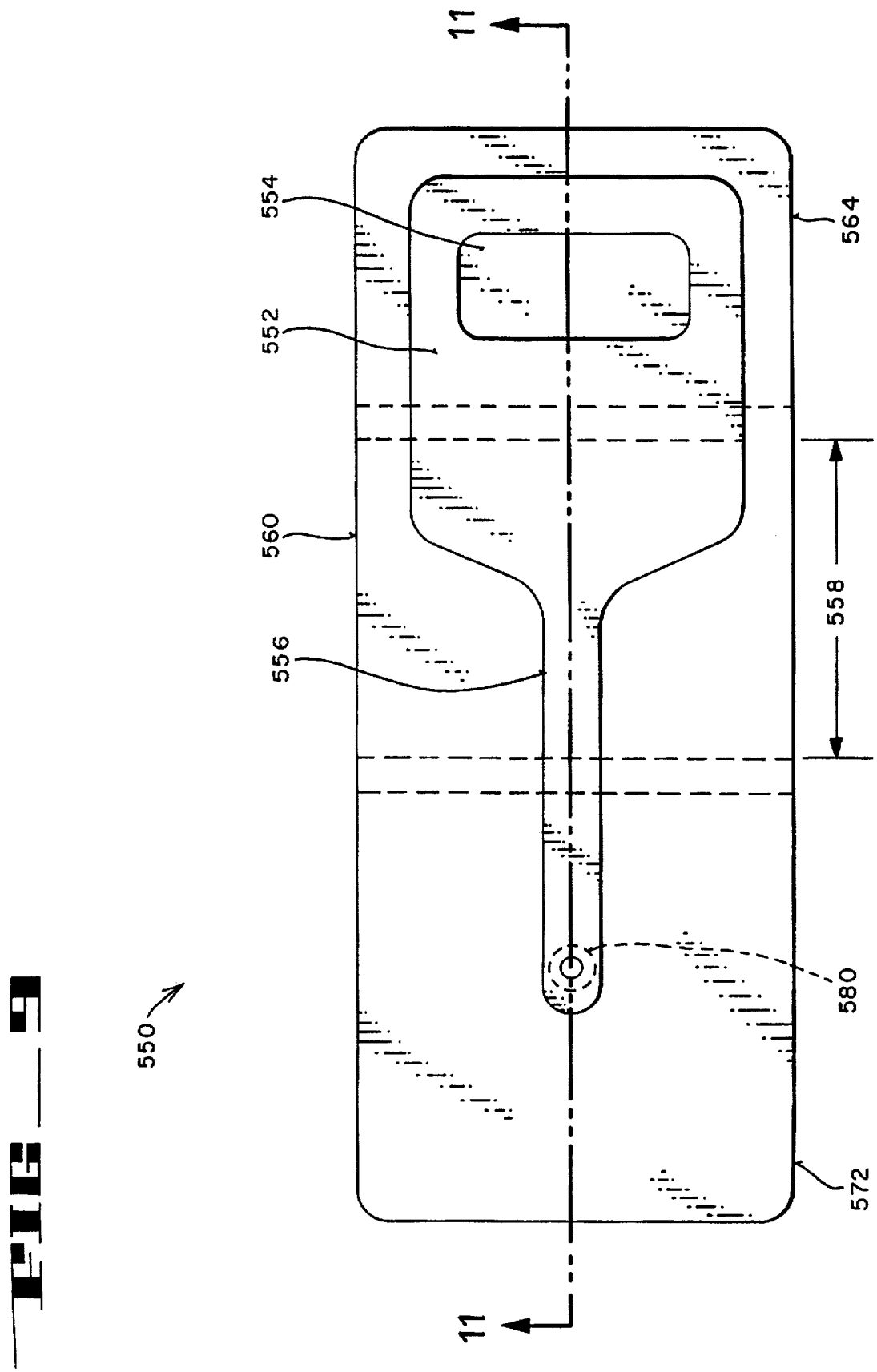

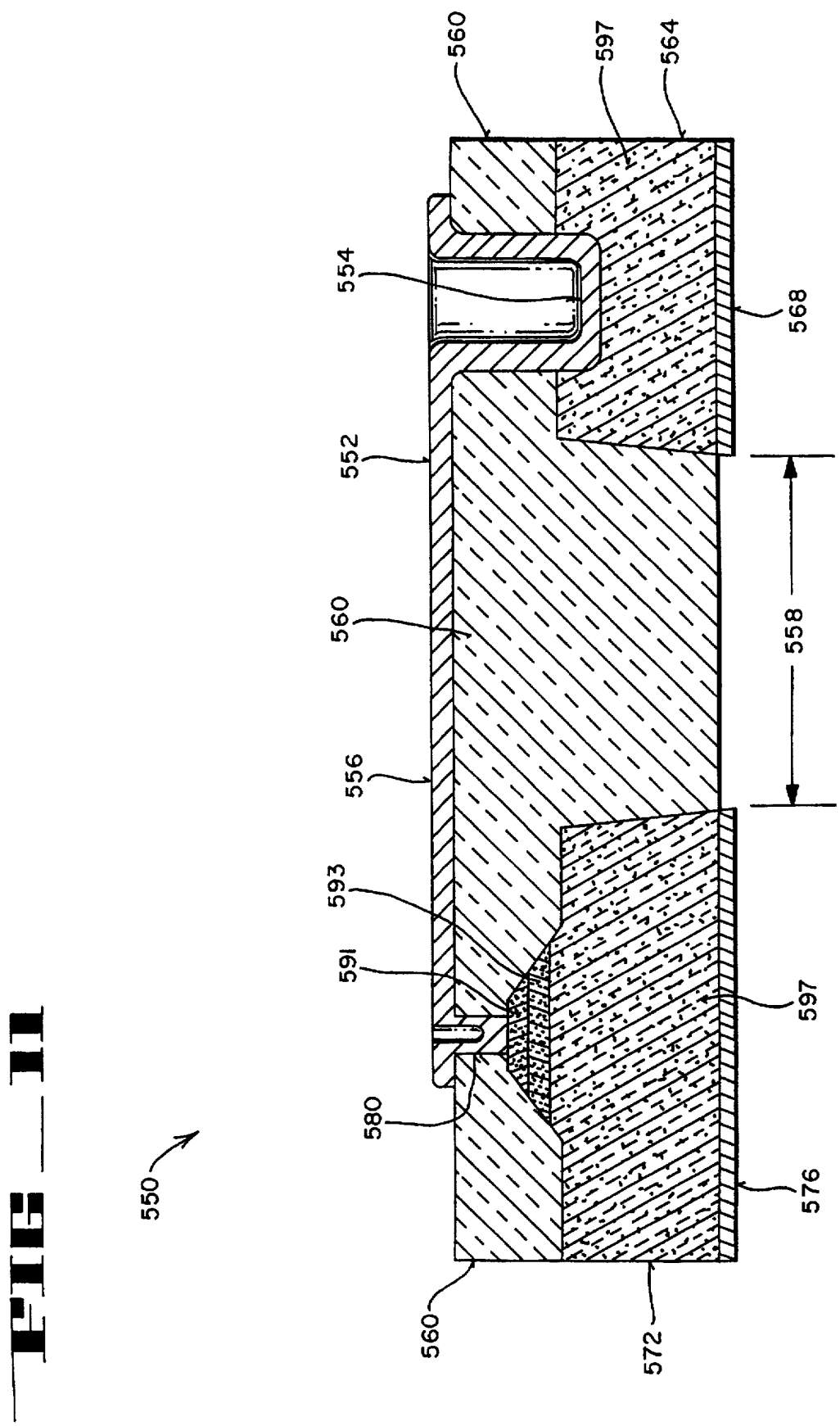
FIG_11

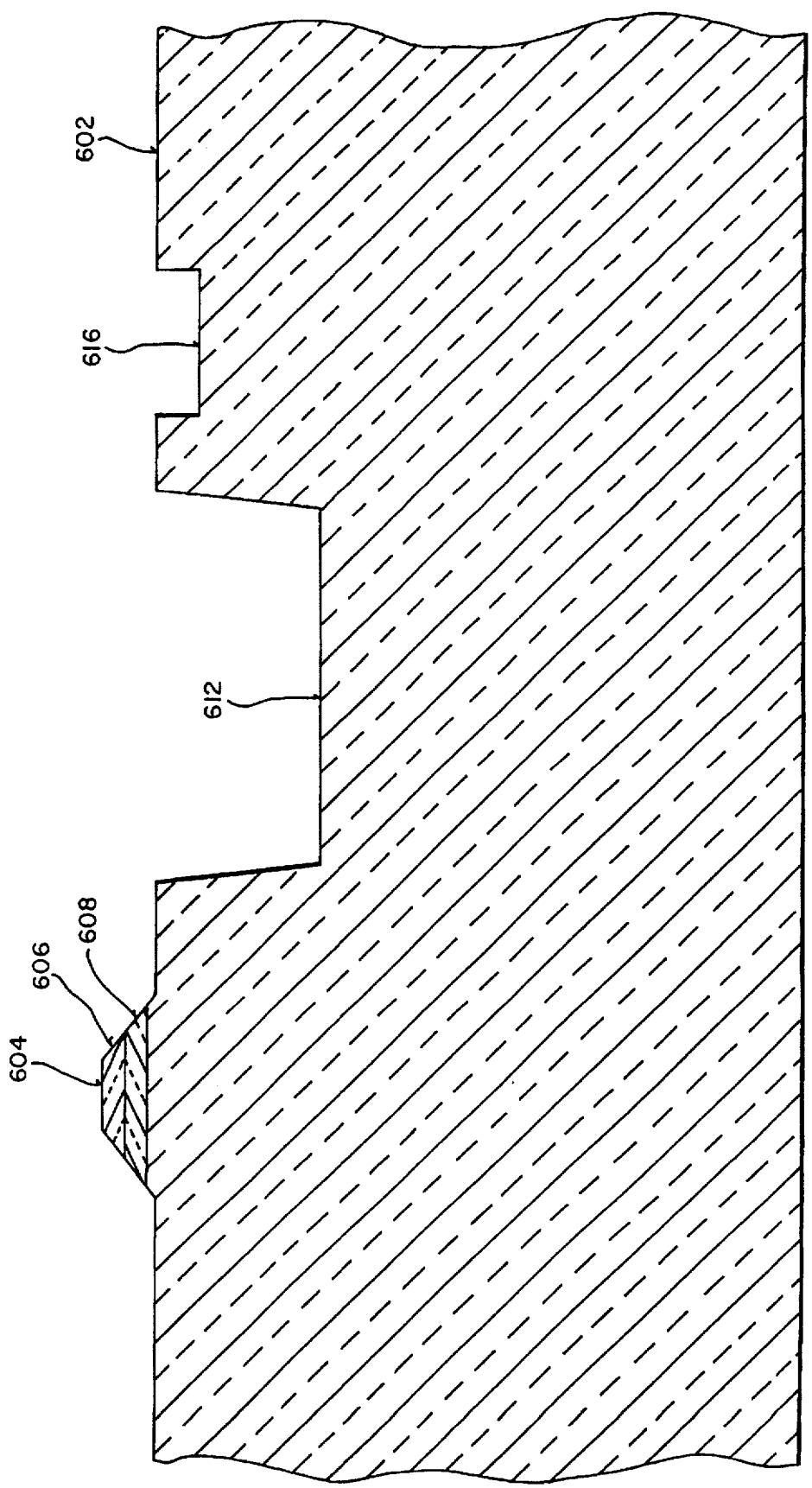

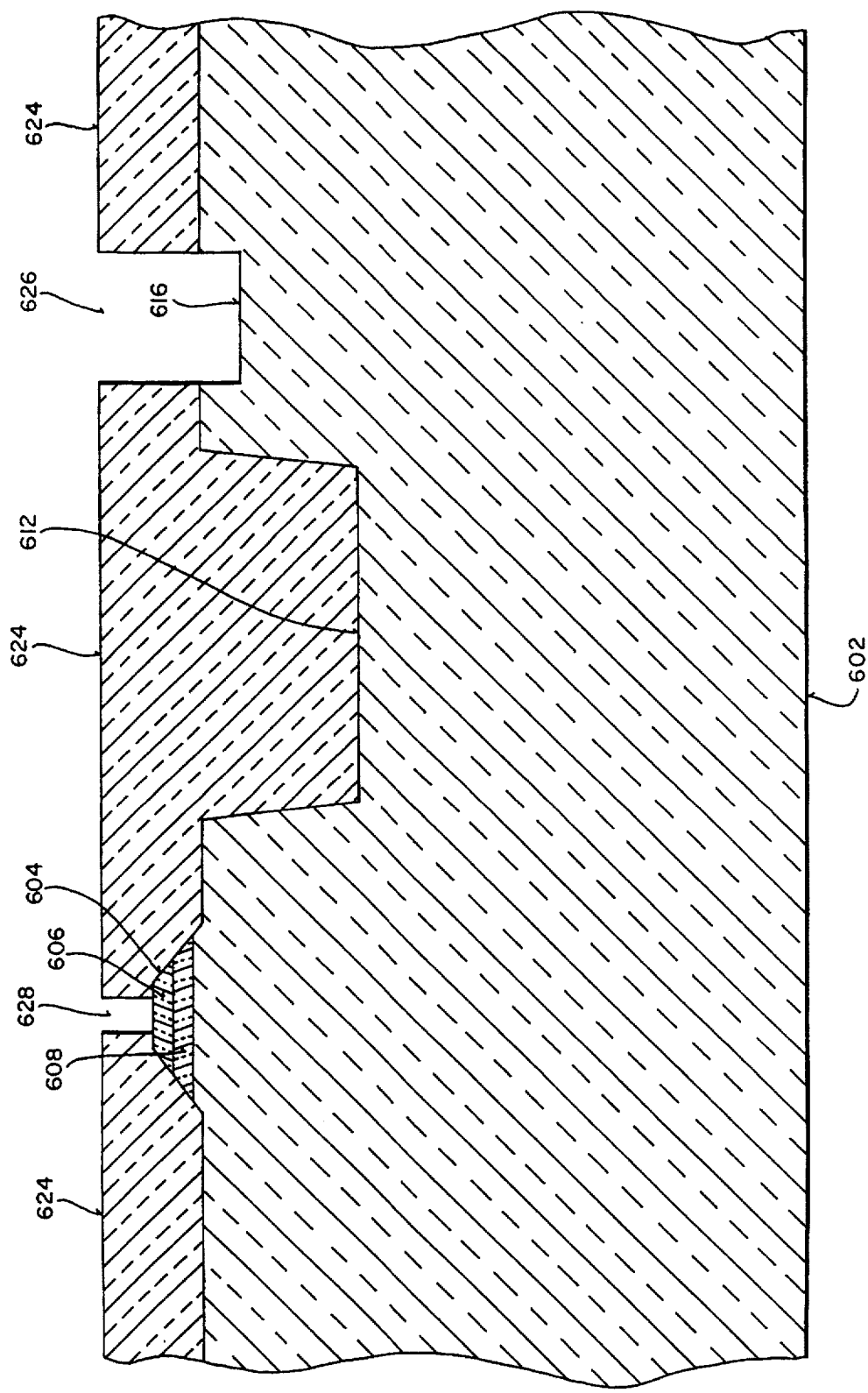

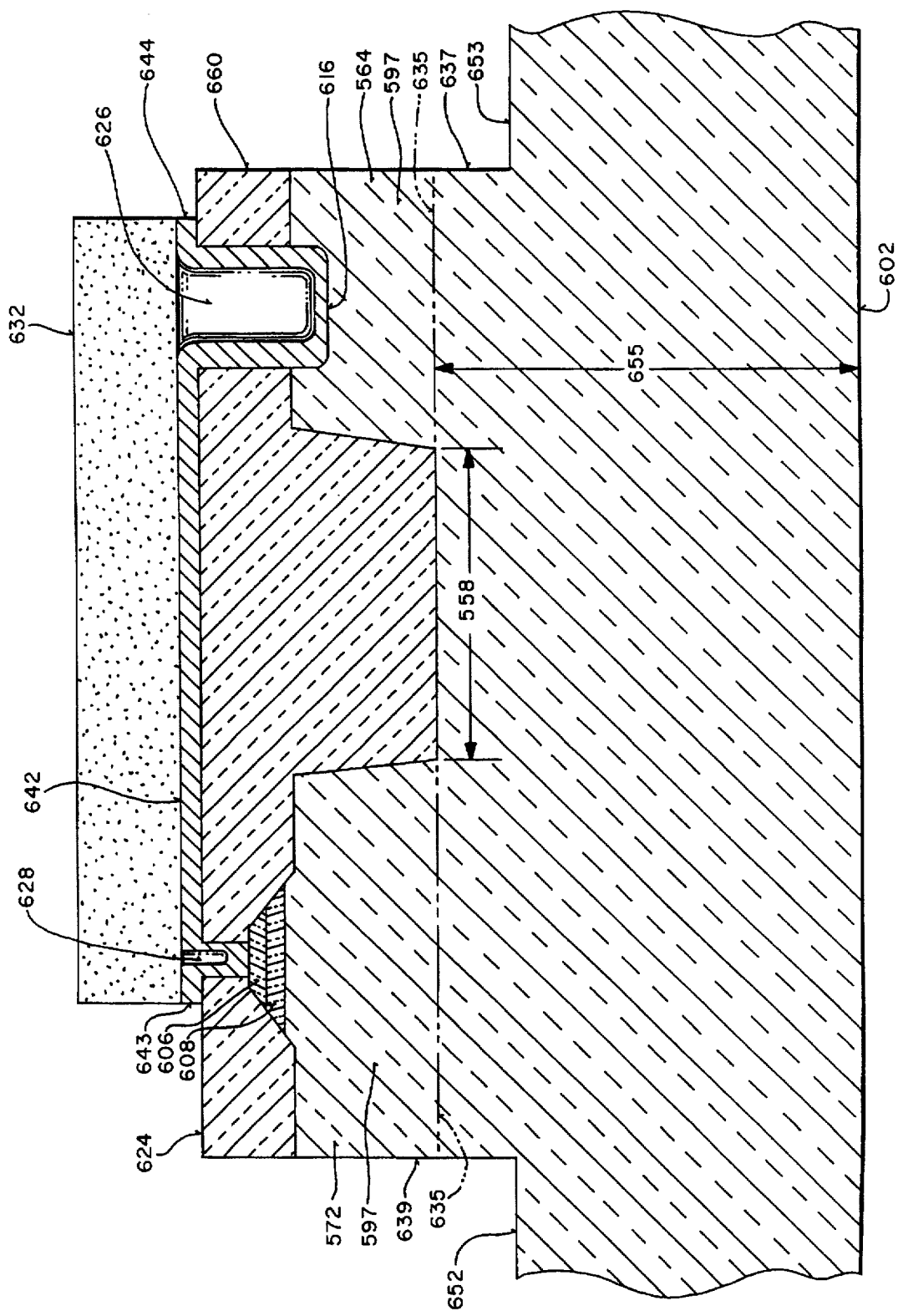
FIG_14

FIG_15
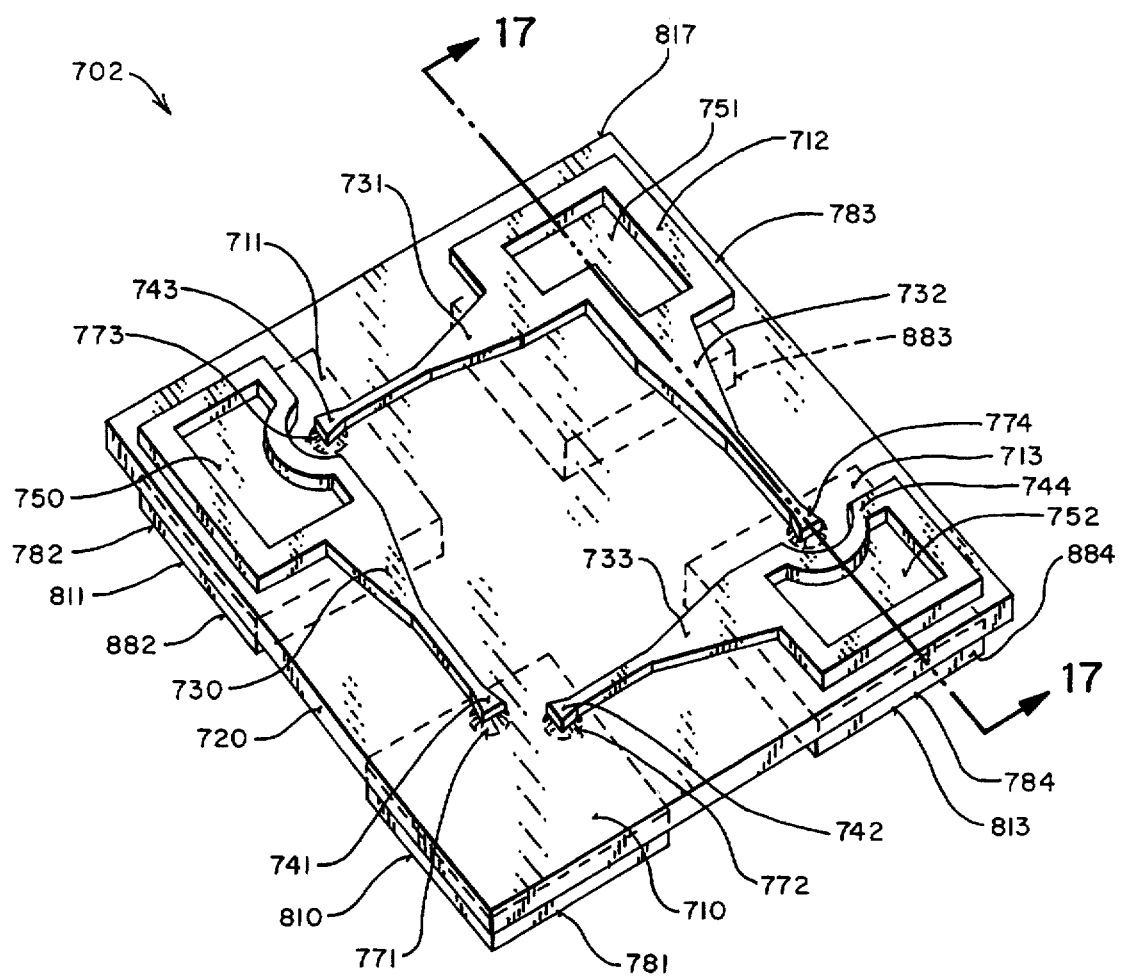

FIG_16
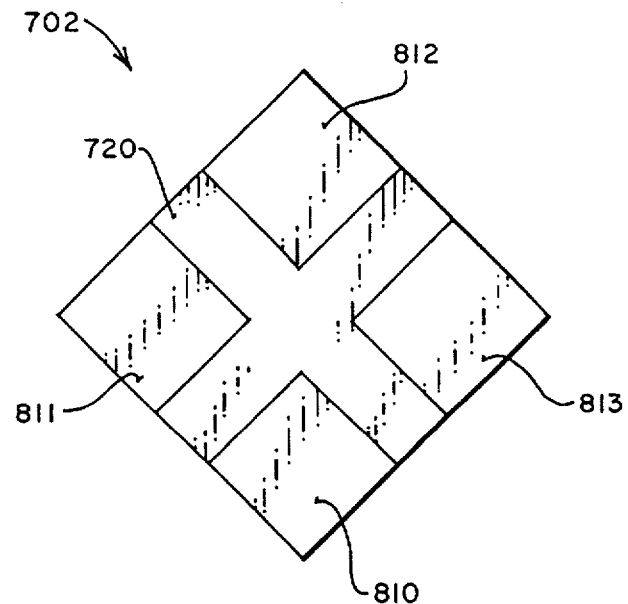
FIG_17
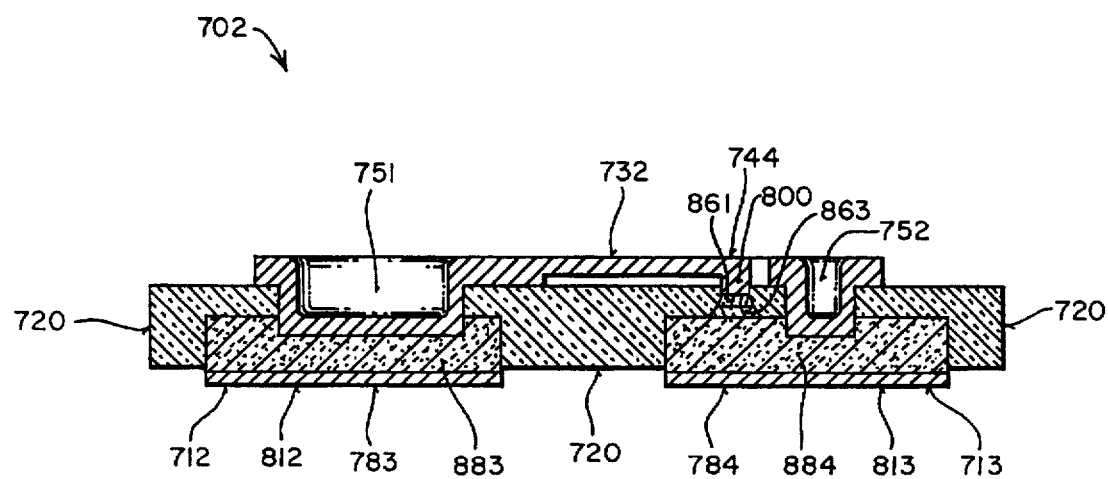

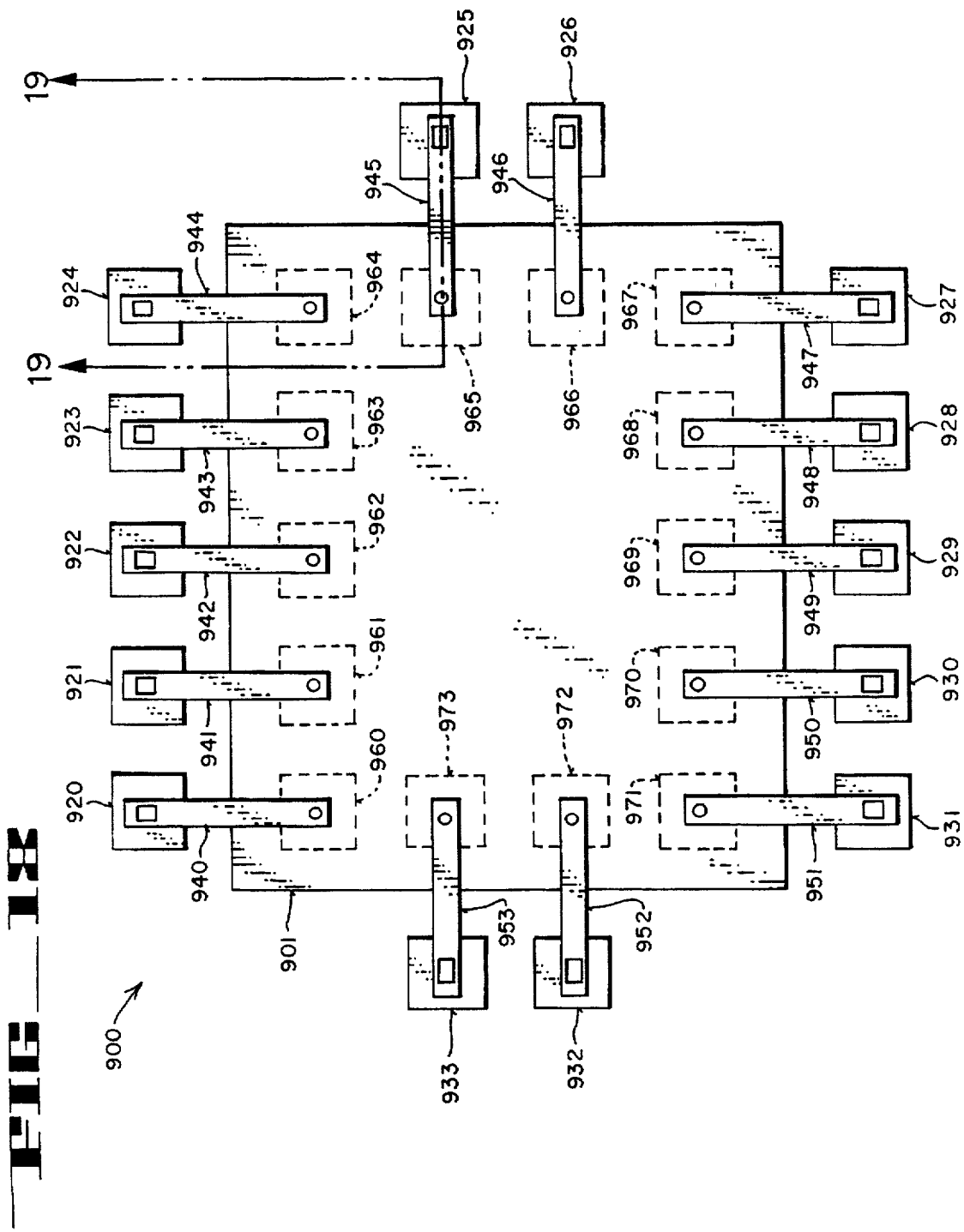

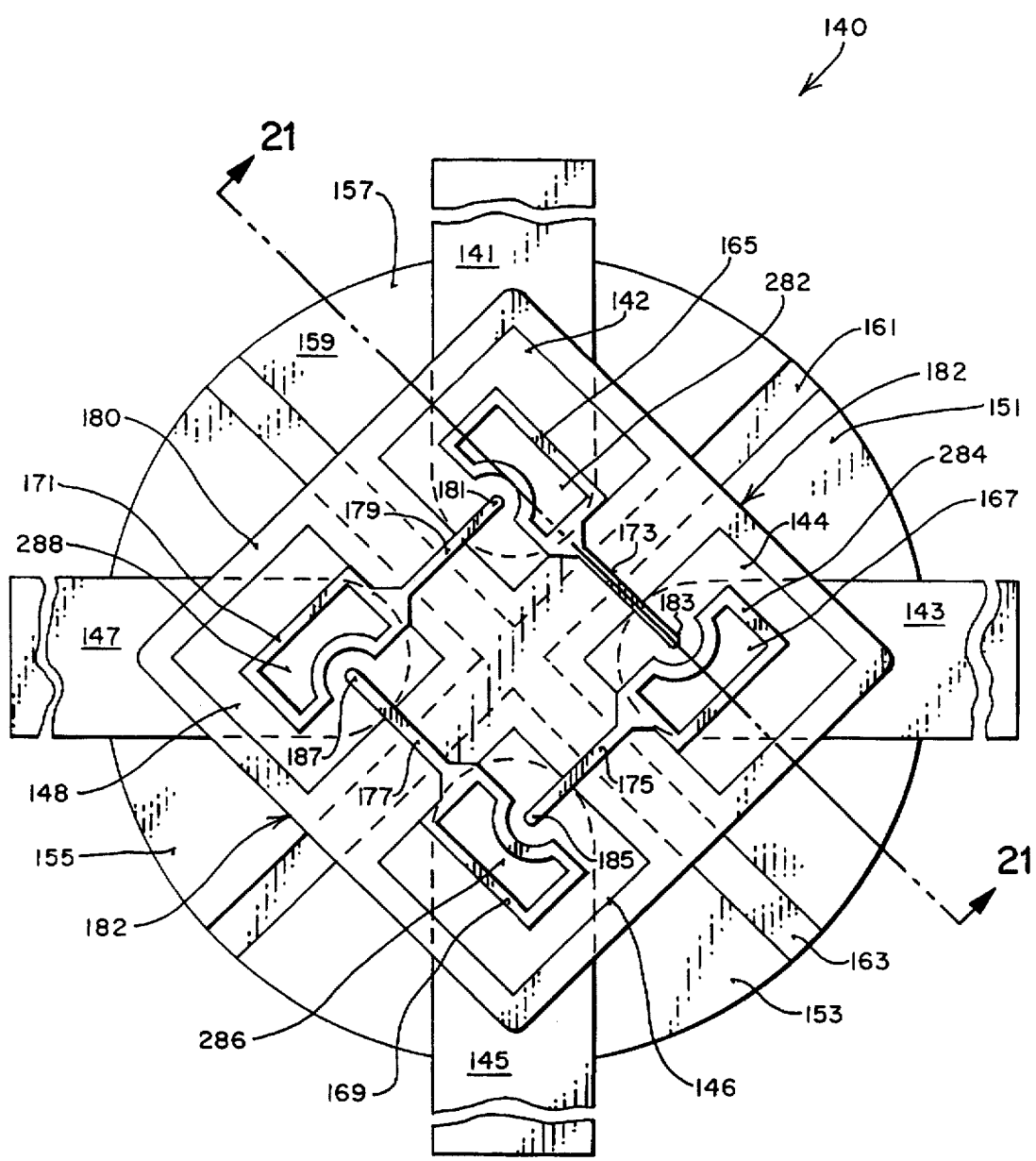
FIG_20

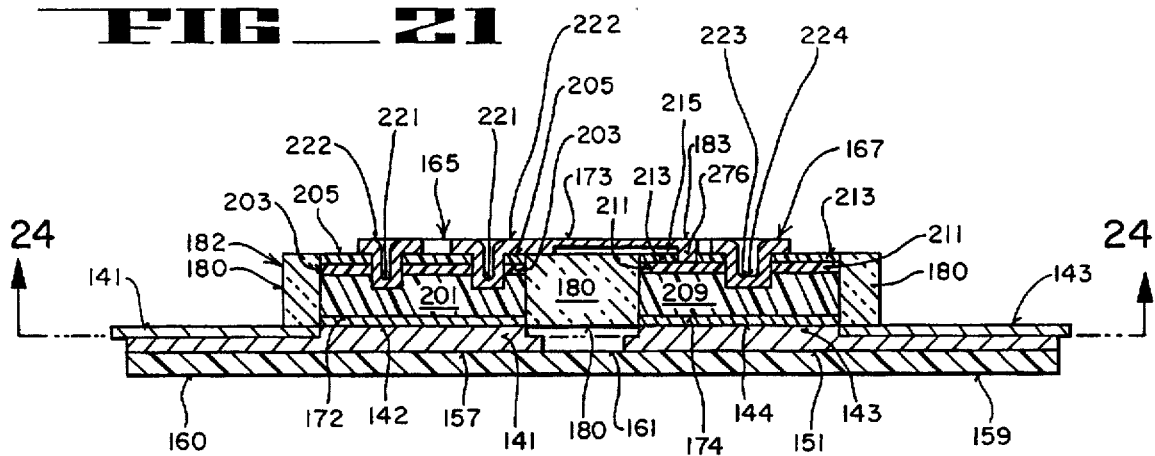
FIG_21
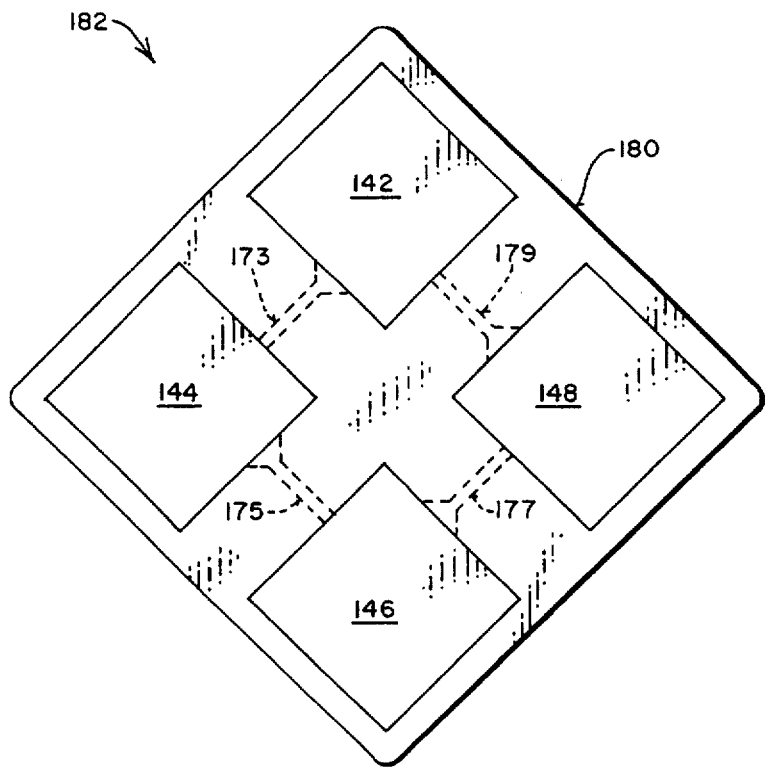
FIG_22

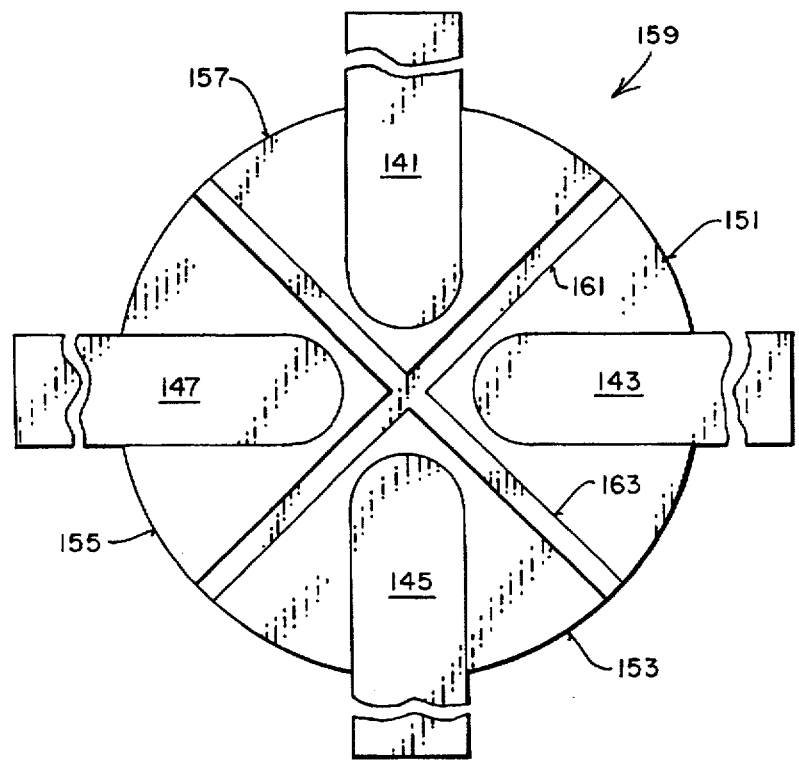
FIG_23
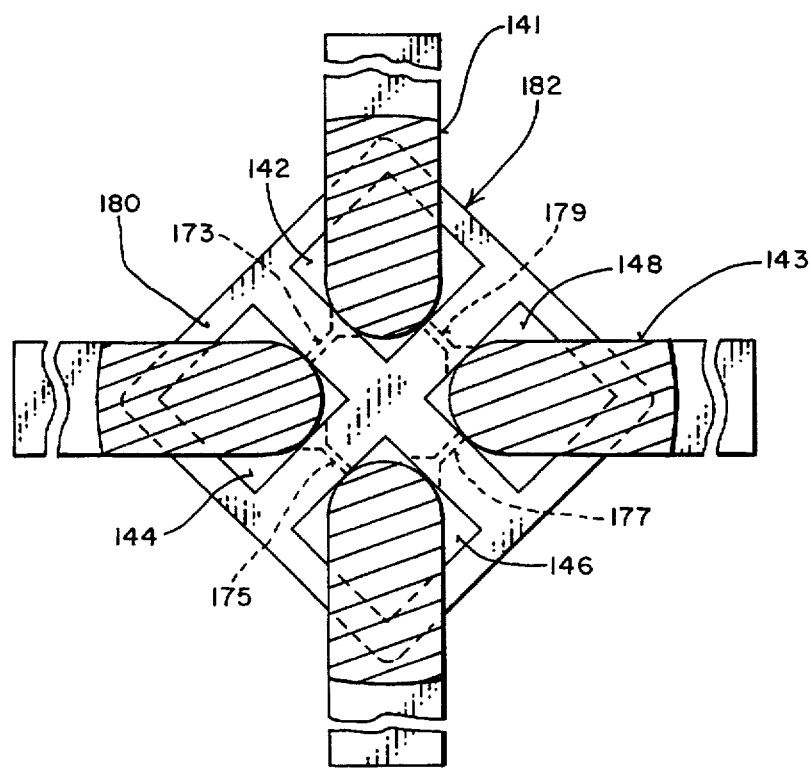
FIG_24

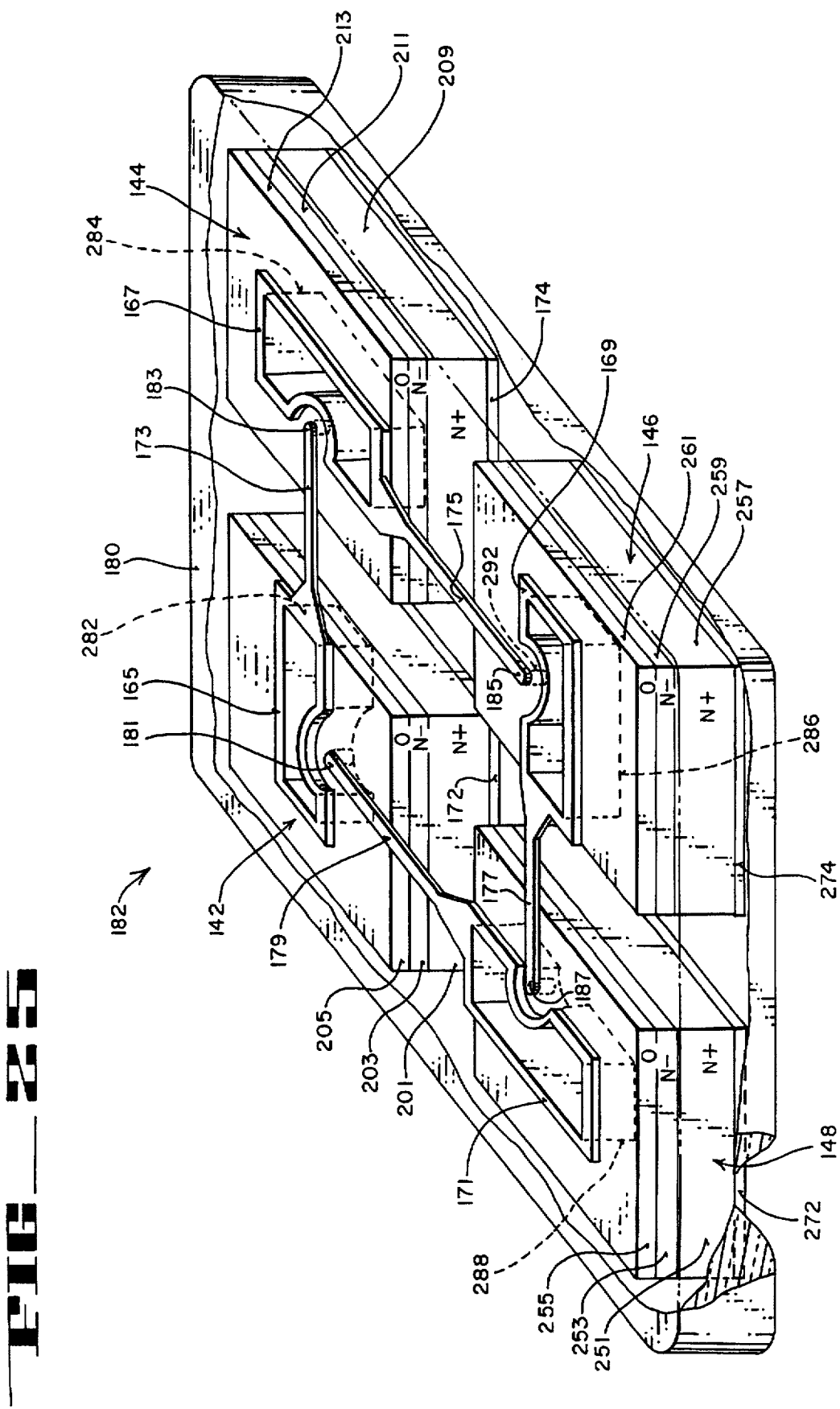
FIG_25

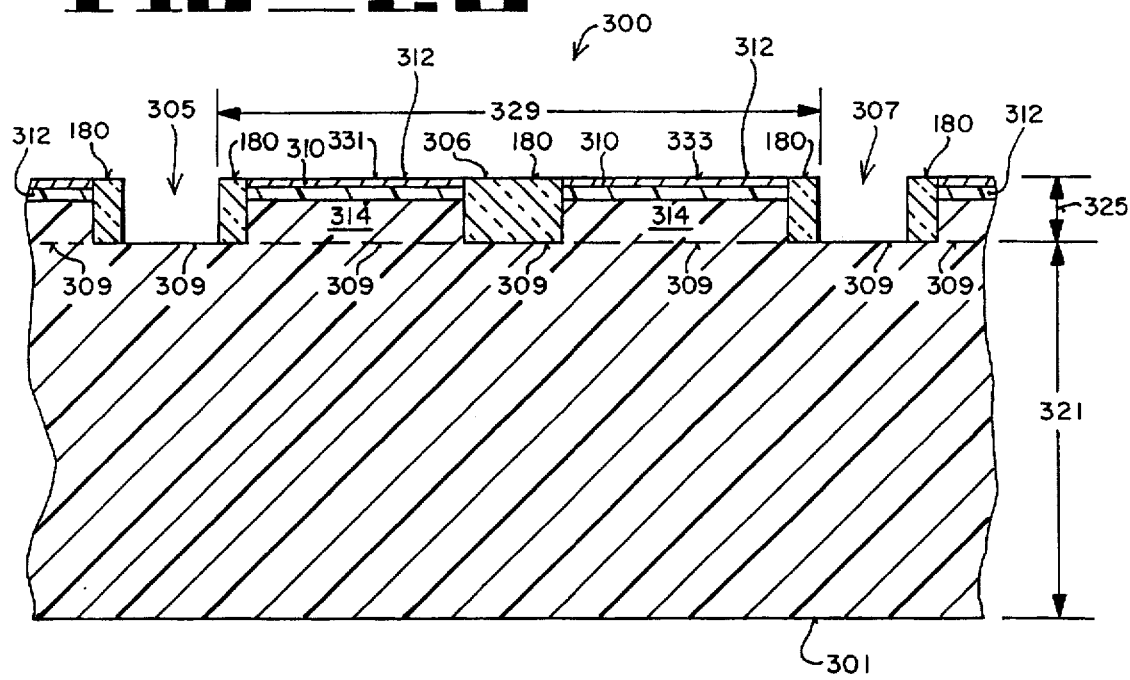
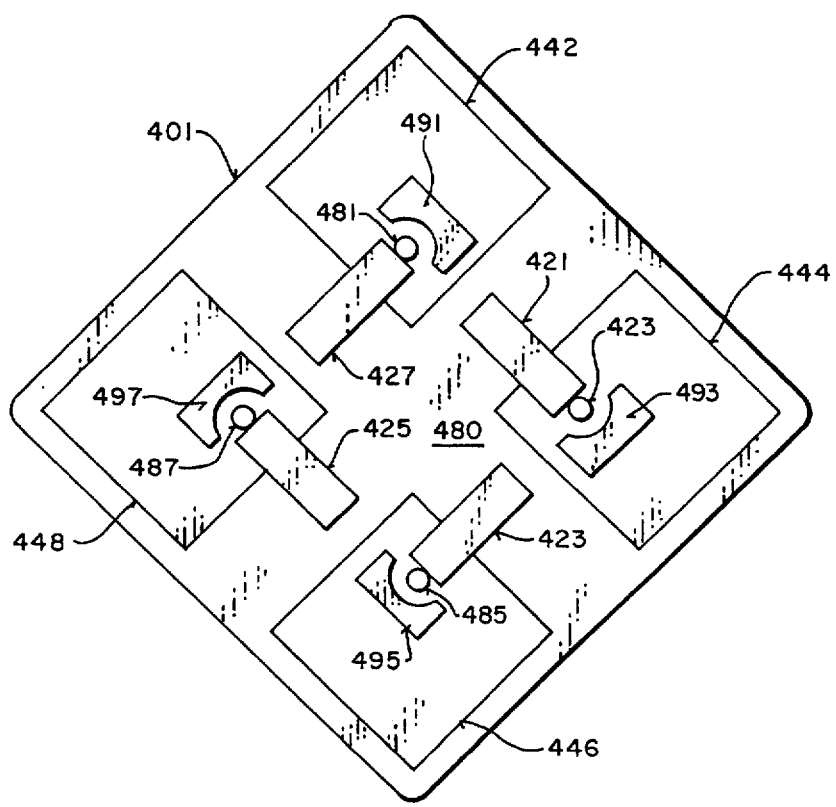

5,789,817

ELECTRICAL APPARATUS WITH A METALLIC LAYER COUPLED TO A LOWER REGION OF A SUBSTRATE AND A METALLIC LAYER COUPLED TO A LOWER REGION OF A SEMICONDUCTOR DEVICE

This is a continuation of application Ser. No. 08/431,990 filed May 1, 1995, now abandoned, which is a continuation of Ser. No. 08/146,699 filed Nov. 2, 1993, now abandoned, which is a continuation of Ser. No. 07/940,763 filed Sep. 4, 1992, now U.S. Pat. No. 5,280,194, which is a continuation of Ser. No. 07/507,397 filed Apr. 10, 1990, now abandoned, which is a continuation-in-part of Ser. No. 07/275,067 filed Nov. 21, 1988, now abandoned.

FIELD OF THE INVENTION

The present invention pertains to the field of microwave devices. More particularly, this invention relates to an electrical apparatus with metallic layers coupled respectively to a lower region of a substrate and a lower region of a semiconductor device. This invention additionally relates to a bridge apparatus and a ring quad.

BACKGROUND OF THE INVENTION

Prior microwave devices include resistors, series shunt elements, and solid-state devices such as Schottky diodes, PIN diodes, varactor diodes, and transistors. In the prior art, four diodes are at times put in one package to form a bridge quad, also known as a sampling bridge. Four diodes are also packaged in the prior art to form a ring quad, also called a quad-ring configuration.

Certain prior microwave devices use beam leads on the tops of the devices to provide connections from the devices to external circuitry. The beam leads for said devices are structurally supported by the diodes of the devices themselves. For example, FIG. 1 illustrates a certain prior microwave diode 2 with a beam lead 4 attached to an anode 5 on the top of the diode 2, and a beam lead 6 attached to a cathode 7 on the top of diode 2.

On certain other prior microwave devices, the beam leads not only provide external connections to such devices, but the beam leads also provide interconnections on the tops of said devices between various terminals of said devices. Again, the beam leads are structurally supported by the bodies of said microwave devices. For example, on certain prior ring quads, the beam leads reside on the tops of the ring quads and provide interconnections between the anodes and cathodes of the respective diodes of the respective ring quads. The beam leads on said prior ring quads also act as "flying" leads to provide connections to external circuitry. The flying beam leads are structurally supported by the diode blocks of said prior ring quads. A glass layer is used in each of certain of said prior ring quads to hold the four diode blocks of the ring quad together.

Certain prior microwave devices with beam leads have certain disadvantages. One disadvantage is the relatively fragile construction of certain prior microwave beam lead devices. Certain prior beam lead devices have relatively low maximum tear strengths. The fragility follows from the fact that the beam leads are attached to the terminals at the top of the devices and from the fact that the beam leads act as large lever arms relative to the small devices.

Another disadvantage of certain prior microwave beam lead devices is their relatively high thermal impedance. In certain such prior devices, heat generated in the device junctions is transferred through small leads to the heat sink. The small size of the leads results in relatively high thermal impedance and reduces the potential power handling capacity of said devices.

Moreover, power dissipation is further constrained in certain such prior devices by the fact that having only connections to the tops of the devices and not to both the tops and bottoms of the devices means that power is not dissipated efficiently throughout the full three-dimensional volumes of the devices. In other words, power is dissipated across portions of said devices rather than efficiently fully through such devices.

Another disadvantage is that certain prior beam lead microwave devices require relatively tedious and delicate assembly operations. Capacitance, inductance, and balance problems can arise from improper bonding of the beam leads. The beam leads for the devices do not always seat properly during packaging. The relatively large beam leads are prone to bending, which can result in capacitance, inductance, and balance problems. Dynamic resistance problems can also arise. Certain prior beam lead devices are typically mounted face down, which can cause inspection problems.

Yet another disadvantage of certain prior beam lead devices is the relatively high inductance associated with the geometric discontinuities between the beam leads and the metallic structures on top of those devices.

FIG. 2 illustrates an electrical schematic of one prior art bridge quad configuration 31 that includes diodes 33, 35, 37, and 39. External connections are made at points 41, 43, 45, and 47 of bridge quad configuration 31. Bridge quad configuration 31 can be used for full-wave rectification, for example.

FIG. 3 illustrates an electrical circuit schematic of one prior art ring quad 10. The cathode of diode 12 is electrically connected to the anode of diode 14 via lines 24 and 26. The cathode of diode 14 is electrically connected to the anode of diode 16 via lines 28 and 30. The cathode of diode 16 is electrically connected to the anode of diode 18 via lines 32 and 34. The cathode of diode 18 is electrically connected to the anode of diode 12 via lines 36 and 22.

The ring quad 10 shown in FIG. 3 can be used in a double-balanced mixer. Flying leads 21, 23, 25, and 27 connect to circuitry 10 at points 11, 13, 15, and 17, respectively. Flying leads 21, 23, 25, and 27 connect to other circuitry (not shown) that uses ring quad 10 in a well-known manner. Such other circuitry could include coupling transistors (not shown), for example.

Good balance is a desirable characteristic of a mixer. To get good balance, the capacitance of each diode in the mixer should be approximately equal. In addition, the inductance of each diode in the mixer should be approximately equal. In other words, the capacitances of diodes 12, 14, 16, and 18 should be approximately equal. In addition, the inductances of diodes 12, 14, 16, and 18 should be approximately equal.

In an early prior art ring quads, wires were used as lines 24, 26, 28, 30, 32, 34, 36, 22, 21, 23, 25, and 27 to provide respective connections to diodes 12, 14, 16, and 18. Such prior art ring quads with wires often exhibited high capacitance, high inductance, and poor balance.

FIG. 4 is the top view of prior art ring quad 50 with beam leads 51, 53, 55 and 57. Beam leads 51, 53, 55, and 57 act as the flying leads for ring quad 50. In packaging prior art ring quad 50, ring quad 50 is turned upside down and beam leads 51, 53, 55, and 57 are welded to respective leads of a lead package (not shown). Ring quad 50 and the lead package (not shown) can be epoxy encapsulated or placed in a ceramic package.

Blocks 52, 54, 56, and 58 are the four diodes of ring quad 50. Diodes 52, 54, 56, and 58 are each Schottky-barrier diodes. For diode 52, a metal-semiconductor junction lies under anode 79. Metal interconnecting structure 71 connects anode 79 to cathode 63. Cathode 63 is a well or depression in which metal reaches down to contact a layer of $N^+$ type silicon. Similarly, metal interconnecting structure 73 connects anode 81 with cathode 65 of diode 56. Metal interconnecting structure 75 connects anode 83 of diode 56 to cathode 67 of diode 58. Likewise, metal interconnecting structure 77 connects anode 85 of diode 58 to cathode 61 of diode 52.

A thin layer of glass 59 structurally holds ring quad 50 together. That is, glass 59 holds diodes 52, 54, 56, and 58 together. Leads 51, 53, 55, and 57 reside above glass 59. In certain other prior art ring quads (not shown), the glass holding the diodes together (i.e., the glass corresponding to glass 59) extends beyond the outer perimeter of the diodes (i.e., extends beyond the outer perimeter or edges of the diodes corresponding to diodes 52, 54, 56, and 58).

In prior art ring quad 50, diode block 52 has to be large enough to support flying beam lead 51. Likewise, diode blocks 54, 56, and 58 must be large enough to structurally support respective beam leads 53, 55, and 57.

FIG. 5 is a cross-sectional side view of ring quad 50 of FIG. 4 taken along line 3—3 of FIG. 3. In FIG. 5, it can be seen that beam lead 57, cathode 67, and interconnecting structure 75 are one piece of metal. At anode 83, a metal-semiconductor junction is formed between Schottky-barrier metal layer 103 and $N^-$ type silicon layer 99. The metal can be titanium, for example. Metal interconnecting structure 75 connects anode 83 with cathode 67. Cathode 67 is comprised of an ohmic contact metal layer with a layer 68 of gold on the top. The metal can be titanium, for example. The metal of cathode 67 contacts from the top surface to layer 91 of $N^+$ type silicon by contacting down into a well or depression, as shown in FIG. 5. The metal outside of the well or depression of cathode 67 becomes lead 57 or interconnecting structure 75. Layer 93 is a layer of $N^-$ type silicon above layer 91. Layer 95 is a oxide layer above layer 95.

Likewise, for diode block 56, cathode 65 is comprised of an ohmic contact metal layer with a layer 66 of gold on top. The metal can be titanium, for example. The metal of cathode 65 contacts from the top surface to layer 97 of $N^+$ type silicon by contacting down into a well or depression, as shown in FIG. 5. The metal outside of the well or depression of cathode 65 becomes lead 55. Layer 99 is a layer of $N^-$ type silicon above layer 97. Layer 101 is a layer of oxide above layer 99.

Layer 59 is a thin layer of glass holding diode blocks 52, 54, 56, and 58 together. Glass layer 59 is typically 18–20 microns thick or approximately two-thirds of a mil thick. The metal leads, including lead 57, are typically about one-half of mil thick. The spacing between the diode blocks, including diode blocks 56 and 58, is typically about 3.5 mils. The combined depth of layers 99 and 97 is typically 2.5 mils.

FIG. 6 is the bottom view of prior art ring quad 50 shown in FIG. 4. Again, diode blocks 54, 52, 58, and 56 are held together by glass 59. Leads 51, 57, 55, and 53 can be seen in part in FIG. 6. Metal interconnecting structure 71, 77, 75, and 73 reside on the other side of glass 59.

FIG. 7 is an pictorial view of prior art ring quad 50 of FIG. 4. As shown in FIG. 7, the flying beam leads 51, 53, 55, and 57 as well as the metal interconnecting structures 71, 73, 75, and 77 all reside on the top of ring quad 50. Thus flying leads 51, 53, 55, and 57, together with interconnections 71, 73, 75, and 77, substantially reside in a two dimensional plane, or, in other words, in two-space. Moreover, the connection of the flying leads 51, 53, 55, and 57 to diodes 52, 54, 56, and 58 of prior art ring quad 50 is quite similar to the way flying leads 21, 23, 25, and 27 are connected to diodes 12, 14, 16, and 18 of prior art ring quad 10 of FIG. 2.

Because flying leads 51, 53, 55, and 57, together with interconnections 71, 73, 75, and 77, approximately reside in a two-dimensional plane, power is not dissipated efficiently throughout the full three-dimensional volume of each diode. In other words, power is dissipated across a portion of each diode of prior art ring quad 50 rather than efficiently fully through each diode. This is especially the case if a signal has a fast rise time, because there is not enough time for the energy to dissipate efficiently throughout the entire volume of diodes 52, 54, 56, and 58 of prior art ring quad 50.

Moreover, given that connections 51, 53, 55, and 57 are made only to the tops of the diodes and that cathode/anode pairs 61/79, 63/81, 65/83, and 67/85 reside relatively close together, pulse transients can sometimes result in carbon trails reaching or jumping from the cathodes to the anodes. Such carbon trails can destroy the cathode/anode topography of prior art ring quad 50.

An additional disadvantage of prior art ring quad 50 is that forming an efficient doubly double-balanced mixer (comprised of eight diodes) in three-space is difficult given that (1) the leads interconnecting the anodes and cathodes of each ring quad and (2) the flying beam leads of each ring quad all reside on the top of each ring quad.

As seen in FIG. 7, each of the diode blocks 52, 54, 56, and 58 has an upper oxide layer, a middle $N^-$ type silicon layer, and a lower $N^+$ type silicon layer. Diode block 52 has an upper oxide layer 125, a middle $N^-$ type silicon layer 123, and a lower $N^+$ type silicon layer 121. Diode block 54 has an upper oxide layer 131, a middle $N^-$ type silicon layer 129, and lower $N^+$ type silicon layer 127. Diode block 56 has an upper oxide layer 101, a middle $N^-$ type silicon layer 99, and a lower $N^+$ type silicon layer 97. Diode block 58 has a upper oxide layer 95, a middle $N^-$ type 93, and a lower $N^+$ silicon layer 91.

Cathode wells 61, 63, 65, and 67 are shown in FIG. 7 extending down to respective $N^+$ layers 121, 127, 97, and 91. Leads 51, 53, 55, and 57 each have a semicircular indentation around anodes 59, 81, 83, and 85. This semicircular indentation or curvature allows the cathode to be close to the anode and at the same time helps to reduce the Faraday effects that result from sharp edges.

Glass 59 resides in a well, or etched pit, in diode blocks 52, 54, 56, and 58.

In fabricating prior art ring quad 50, an oxide layer is first formed on top of a thick wafer of silicon. The silicon has an $N^-$ type layer below the oxide and a $N^+$ type layer below the $N^-$ layer. A mask, or pattern, is then applied to the front oxide layer. The oxide is then etched away according to the pattern. A relatively large area is etched to provide a location for glass. Oxide islands or mesas are left after the etching process. Glass fill is applied. The glass is heated and flows across the top of the ring quad and resides in the etched areas for the glass.

Deep etches are made into the silicon to form cathode wells. Smaller openings are etched through the oxide to form anodes.

A first layer of metal is deposited by metal deposition in a high-vacuum system to the top of the wafer. A second layer of metal is then deposited by metal deposition in a high-vacuum system over the first layer of metal. The first layer of metal can be titanium, for example, and the second upper layer of metal can be gold.

The first layer of metal enters the cathode wells or depressions during deposition such that the first layer of metal contacts the N+ layer of silicon to form cathodes. The first layer of metal also enters the anode openings during deposition such that the first layer of metal contacts the N− layer of silicon to form anodes. The first layer of metal in the anode openings acts as the metal-semiconductor injunction for each of the anodes.

A leads and interconnecting structures are defined on the top of the silicon wafer by using common masking and metal etching techniques. The plated leads and interconnecting structures are defined such that metal runs out of cathodes 61, 63, 65, and 67 to form respective leads 51, 53, 55, and 57 and interconnecting structures 71, 73, 75, and 77.

The silicon wafer is then etched from behind in order to form diode blocks 25 52, 54, 56, and 58. In order to package the prior art ring quad, the prior art ring quad is turned upside down and beam leads 51, 53, 55, and 57 are welded to respective leads of a lead package (not shown). Ring quad 50 and the lead package (not shown) can be epoxy encapsulated or placed in a ceramic package.

Beam leads 51, 53, 55, and 57 of prior art ring quad 50 do not always seat properly during packaging. The relatively large beam leads 51, 53, 55, and 57 are also prone to bending, resulting in capacitance, inductance, and balance problems. Resistance problems can also arise from the welding operation.

Prior art ring quad 50 can be fragile given (1) that a relatively thin layer of glass 59 is used to hold the four diodes 52, 54, 56, and 58 together and (2) that the flying beam leads 51, 53, 55, and 57 present a relatively large lever arm to the top of ring quad 50.

SUMMARY AND OBJECTS OF THE INVENTION

In view of the limitations of known microwave devices, one of the objectives of the present invention is to provide an electrical apparatus that is relatively rugged and is relatively easy to handle.

Another objective of the present invention is to provide an electrical apparatus that has relatively low thermal impedance and relatively good power dissipation.

A further objective of the present invention is to provide an electrical apparatus with relatively low inductance.

An electrical apparatus comprising a first substrate, a first metallic layer, a semiconductor, a second metallic layer, and a metallic interconnecting structure is described. The first substrate is comprised of a semiconductor material and has an upper region and a lower region. The substrate provides an electrical path between the upper region and the lower region. The first metallic layer is coupled to the lower region of the substrate. The first metallic layer provides a first external electrical connection. The semiconductor device has an upper region and a lower region. The second metallic layer is coupled to the lower region of the semiconductor device. The second metallic layer provides a second external electrical connection. The metallic interconnecting structure electrically couples the upper region of the first substrate to the upper region of the semiconductor device.

A bridge apparatus comprising a first block, a second block, a third block, a fourth block, a first metallic interconnecting structure, a second metallic interconnecting structure, a third metallic interconnecting structure, and a fourth metallic interconnecting structure is also described. The first block comprises a first anode of a first diode, a second anode of a second diode, a first cathode common to both the first diode and the second diode, and a first metallic layer. The first anode resides in an upper region of the first block. The second anode resides in the upper region of the first block. A portion of the first cathode resides in a lower region of the first block. The first metallic layer is coupled to the first cathode at a location in the lower region of the first block. The first metallic layer provides a first external electrical connection. The second block comprises a third anode of a third diode, a second cathode of the third diode, and a second metallic layer coupled to the second cathode at a location in the lower region of the second block. The third anode resides in an upper region of the second block. A portion of the second cathode resides in a lower region of the second block. The second metallic layer provides a second external electrical connection. The third block comprises a fourth anode of a fourth diode, a third cathode of the fourth diode, and a third metallic layer coupled to the third cathode at a location in the lower region of the third block. A fourth anode resides in an upper region of the third block. A portion of the third cathode resided in a lower region of the third block. The third metallic layer provides a third external electrical connection. The fourth block comprises a first substrate comprised of a semiconductor material and having an upper region and a lower region, and a fourth metallic layer coupled to the lower region of the substrate. The first substrate provide an electrical path between the upper region and the lower region of the first substrate. The fourth metallic layer provides a fourth external electrical connection. The first metallic interconnecting structure electrically couples the first anode to an upper portion of the second cathode. The second metallic interconnecting structure electrically couples the second anode to an upper portion of the third cathode. The third metallic interconnecting structure electrically couples the third anode to the upper region of the first substrate. The fourth metallic interconnecting structure electrically couples the fourth anode to the upper region of the first substrate.

A method of fabricating an electrical apparatus is also described. A mesa comprised of a layer of a first type of semiconductor material and a layer of a second type of semiconductor material is formed on a substrate of a wafer of a third type of semiconductor material. A first well is formed in an upper region of the substrate of the wafer. A second well is formed in the upper region of the substrate between the mesa and the first well. The second well is deeper than the first well. The mesa, a top of the substrate, and the first and second wells are covered with a layer of glass. An opening is formed through the glass to the top of the mesa. An opening is formed through the glass to a bottom of the first well. A metallic interconnecting structure is formed that electrically couples the bottom of the first well to the top of the mesa over a portion of the layer of glass between the mesa and the first well. A module is formed that includes the metallic interconnecting structure, a portion of the layer of glass, the mesa, the first well, the second well, and a portion of the substrate of the wafer. The semiconductor material residing below a bottom of the second well is removed in order to form a first discrete region of semiconductor material that includes the first well and a second discrete region of semiconductor material that includes the mesa. Metal is applied to a bottom of the first region and a bottom of the second region.

Other objects, features, and advantages of the present invention will be apparent from the accompanying drawings and from the detailed description that follows below.

BRIEF DESCRIPTION OF THE DRAWINGS

The present invention is illustrated by way of example and not limitation in figures of the accompanying drawings, in which like references indicate similar elements, and in which:

FIG. 1 is pictorial view of a prior art diode.

FIG. 2 is an electrical circuit diagram of a prior bridge quad comprised of four diodes.

FIG. 3 is an electrical circuit diagram of a prior ring quad comprised of four diodes.

FIG. 4 is a top view of a prior art ring quad.

FIG. 5 is a side cross-sectional view of the prior art ring quad of FIG. 4.

FIG. 6 is a bottom view of the prior art ring quad of FIG. 4.

FIG. 7 is an pictorial view of the prior art ring quad of FIG. 4.

FIG. 8 is a pictorial view of an electrical apparatus.

FIG. 9 is a top view of the electrical apparatus of FIG. 8.

FIG. 11 is a side cross-sectional view of the electrical apparatus of FIG. 8.

FIG. 12 is a cross-sectional side view of the electrical apparatus during one stage of fabrication.

FIG. 13 is a cross-sectional side view of the electrical apparatus during another stage of fabrication.

FIG. 14 is a cross-sectional side view of the electrical apparatus during yet another stage of fabrication.

FIG. 15 is a pictorial view of a bridge quad.

FIG. 16 is a bottom view of the bridge quad of FIG. 15.

FIG. 17 is a side cross-sectional view of a portion of the bridge quad of FIG. 15.

FIG. 18 is a top view of a package for an integrated circuit.

FIG. 20 is a top view of a ring quad with lower leads.

FIG. 21 is a side cross-sectional view of the ring quad of FIG. 20.

FIG. 22 is a bottom view of a module of four diodes of a ring quad.

FIG. 23 is a top view of the lower lead package of a ring quad.

FIG. 24 is a bottom cross-sectional view of a ring quad.

FIG. 25 is an pictorial view of a ring quad, which does not show the lower lead package.

FIG. 26 is a cross-sectional side view of a ring quad during fabrication.

FIG. 27 is a top view of a ring quad during fabrication.

DETAILED DESCRIPTION

Figure 10:
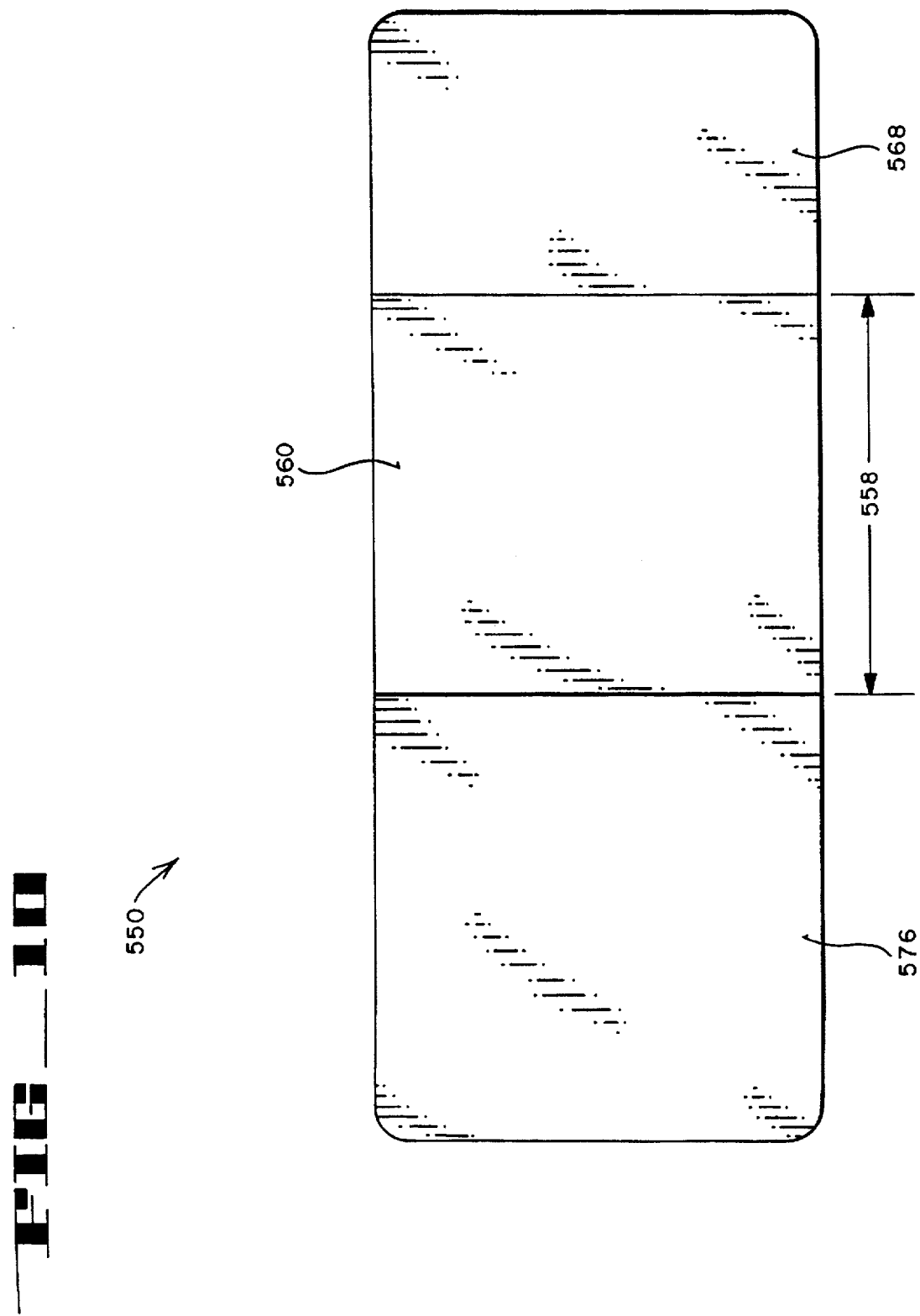
FIG. 10 is a bottom view of the electrical apparatus of FIG. 8.

FIG. 8 is a pictorial view of diode 550. In a preferred embodiment of the present invention, diode 550 is a PIN diode and is a series element for use as a switch. A thin N– region separates P+ and N+ regions. The thin N-region is also referred to as the instrinsic I region. Diode 550 is also referred to as electrical apparatus (or device) 550 that includes a diode.

In one alternative embodiment of the present invention, diode 550 is a series NIP diode, wherein a thin P⁻ region separates N⁺ and P⁺ regions. In another alternative embodiment of the present invention, diode 550 is a Schottky-barrier diode. In yet another alternative embodiment of the present invention, diode 550 is a series shunt element.

In a preferred embodiment, diode 550 of FIG. 8 is a leadless monolithic device. Diode 550 is configured for surface mounting. Diode 550 comprises a first chip 572, a second chip 564, a stripline 552, glass frame 560, and metalized bottom layers 568 and 576. Glass frame 560 provides relatively high insulation.

The diode junction resides in integrated circuit block 572 of diode 550. Stripline 552 is coupled to integrated circuit block 572. Portion 556 of stripline 552 is connected to diode block 572.

Stripline 552 extends across gap 558 between first chip 572 and second chip 564. Gap 558 is the gap between first chip 572 and second chip 564. Stripline 552 is then connected to second chip 564.

Stripline 552 connects with second chip 564 via well or depression 554. Well 554 is a trough coupled to stripline 552. Second chip 564 is a short between depression 554 of stripline 552 and metalized bottom 568. Second chip 564 is comprised of N+ type silicon.

FIG. 9 is a top view of diode 550. Area 580 of FIG. 9 is where stripline 552 couples to chip 572. As seen in FIG. 9, stripline 552 extends across gap 558 via portion 556 to area 580. Stripline 552 is coupled to chip 564 via depression 554.

FIG. 10 is a bottom view of diode 550. FIG. 10 shows metalized bottom portions 576 and 568. Metalized bottom portion 576 is coupled to chip 572. Metalized bottom portion 568 is coupled to second chip 564. Metalized bottom portions 576 and 568 are the connection points for diode 550 to other circuitry. As can be seen in FIG. 10, metalized bottoms 576 and 568 provide relatively large connection pads for connection to external circuitry. FIG. 10 also illustrates insulating glass frame 560 and gap 558 between pad 576 of first chip 572 and pad 568 of second chip 564.

FIG. 11 is a cross-sectional side view of diode 550 taken along line 11—11 of FIG. 9. In FIG. 11, chip 572 contains the diode. A region 593 of N– silicon separates P+ region 591 from N+ region 597. The region 593 is also referred to as the intrinsic I region 593. Chip 572 thus comprises a P⁺ region 591, an N– region 593, and an N+ region 597.

P+ region 591, N– region 593, and N+ region 597 form a mesa structure. A mesa is a plateau of semiconductor material with relatively steep sides.

In an alternative embodiment of the present invention, region 591 would be an N region, region 593 would be an intrinsic I region, and region 597 would be a P region. In another alternative embodiment of the present invention, chip 572 would contain a Schottky-barrier diode. In yet another alternative embodiment of the present invention, chip 572 would be a resistor.

In a preferred embodiment of the present invention, chip 572 is a monolithic integrated circuit, which means it is constructed within a single wafer of semiconductor material. The N⁺ layer 597 of chip 572 is metalized on the bottom to form contact metal layer 576. The contact metal of layer 576 can be nickel-arsenic-gold, for example. Contact metal layer 576 is flat and relatively large, which helps to ensure good contact with external circuitry.

Stripline 552 runs between the P+ region 591 of the first chip 572 and the N+ region 597 of second chip 564. Stripline 552 is comprised of an ohmic contact metal layer with a very thin layer of gold on top. The ohmic contact metal can be titanium, for example. The gold layer (not shown) inhibits the oxidation of the contact metal of stripline 552.

Stripline 552 contacts the P$^+$ region 591 via portion 556 and 580. Stripline 552 contacts the N+ region of second chip 564 by reaching down to the N+ region 597 by way of depression 554. Stripline 552 resides on top of glass 560. Insulating glass frame 560 separates first chip 572 from second chip 564. A gap 558 separates first chip 572 from second chip 564.

Second chip 564 is comprised of a single layer 597 of N+ type silicon. Contact layer 568 resides on the bottom of second chip 564 and is formed by metalizing the bottom of second chip 564. The contact metal of layer 568 can be nickel-arsenic-gold, for example. Contact metal layer 568 is flat and relatively large, and this helps to ensure good contact with circuitry external to diode 550. Metalized bottoms 568 and 576 are also referred to as the back contacts.

In a preferred embodiment of the present invention, gap 558 is 13 mils across. In a preferred embodiment of the present invention first chip 572 is 12 mils long, 10 mils wide, and 5 mils high. In a preferred embodiment in the present invention, second chip 564 is 5 mils long, 10 mils wide, and 5 mils high. Thus, the overall length of diode 550 is 30 mils.

Device 550 has a relatively low thermal impedance. The thermal energy of diode 550 can be conducted directly to an external circuit connected to the device 550 through the bottom of diode 550. This conductance of the thermal energy of diode 550 through the bottom of diode 550 improves the power handling capability of device 550.

Diode 550 may be die-attached across standard beam circuit gaps using either solder or conductive epoxy. Interconnect areas of device 550 are face-up after installation, which means that device 550 can be inspected for damage from the top.

Device 550 can be configured to be a drop-in replacement for present beam lead devices. Alternatively, device 550 can be made smaller or larger to address a custom requirement. The design of diode 550 allows the device to be made relatively small.

Device 550 has a relatively high tear strength.

Device 550 has relatively few parasitic circuit elements. Diode 550 also has relatively low inductance. Moreover, device 550 has a relatively high power rating. Diode 550 can typically handle direct current and currents with frequencies ranging to approximately the order of Gigahertz.

In a preferred embodiment, diode 550 is in monolithic form. In an alternative embodiment of the present invention, diode 550 is in a packaged form. In an alternative embodiment of the present invention, diode 550 could be encased in glass to form a hermetic seal.

Possible applications for diode 550 include mixers, detectors, switches, modulators, attenuators, multiplexers, comb generators, phase detectors, and phase shifters.

FIGS. 12, 13, and 14 illustrate the stages of the fabrication process for diode 550. The fabrication process starts with a wafer 602 of N+ type silicon. Layer 608 comprised of N– type silicon is then formed by epitaxial growth. Layer 606 of P+ type silicon is then formed by boron diffusion into wafer 602. Wafer 602 is then subjected to an oxidation process that results in a layer of silicon dioxide being formed on the surface of wafer 602.

In an alternative process of the invention, the fabrication process starts with a wafer of P$^+$ type silicon. In the alternative process, a middle P– layer is formed, and then an upper N$^+$ layer is formed.

In the preferred process, a photolithography process is used to form mesa 604, well or depression 612, and well or depression 616 in wafer 602. The photolithography process is as follows.

A mask is prepared on a glass plate. The mask determines which areas of silicon dioxide layer on the top of wafer 602 are to be removed. The silicon dioxide layer of wafer 602 is coated with a thin layer of photosensitive material called photoresist. The layer of photoresist is covered by the mask and an ultraviolet light is applied. The mask causes the ultraviolet light to be applied only to certain regions of the photosensitive material. The resulting wafer is subjected to a chemical solution that removes only the portions of the photosensitive material not exposed to the ultraviolet light. A second solution is applied that etches away silicon dioxide in areas not covered by the photoresist material. Thus, silicon dioxide is etched away in order to form mesa 604 and wells 612 and 616. The next step is the removal, by solution, of the remaining photosensitive material. The process for forming mesa 604, well 612, and well 616 is also referred to as the pit etch process.

As shown in FIG. 13, a layer 624 of glass is applied on top of wafer 602. The photolithography process is used to etch openings 626 and 628 in the glass. Opening 626 is above depression 616 of wafer 602. Opening 628 is above mesa 604 of wafer 602. The etching process is as follows. The layer 624 of glass is coated with a thin layer of photoresist. This new layer is covered by a mask, and ultraviolet light is applied. The ultraviolet light exposes the areas of the photosensitive material not covered by the masking pattern. The resulting wafers is subjected to a chemical solution that removes the unexposed photosensitive material. A second solution is applied, and the second solution etches away the glass from any region not covered by the photoresist material. In this case, the etching solution etches away the glass to form openings 626 and 628. The remaining photosensitive material is removed by using a solution.

Referring to FIG. 14, the first layer of metal is deposited by metal deposition in a high-vacuum system on top of layer 624 of glass of wafer 602. The first layer of metal 642 extends into opening 628 and contacts the P$^+$ region 606 of silicon. The first layer of metal 642 also coats the sides of opening 626 and depression 616, and the first layer of metal 642 thereby contact the N$^+$ layer 597 of silicon. In a preferred embodiment of the invention, the metal is titanium and is referred to as the contact metal. In alternative embodiments of the present invention, Nichrome, nickel, and other metals could be used instead of titanium to form layer 642 in order to create stripline 552.

A second layer of metal is deposited by metal deposition in a high-vacuum system over the first layer 642 of metal of wafer 602. In a preferred embodiment of the present invention, the second layer of metal is gold. The layer of gold helps to inhibit the oxidation of the titanium and aids gold plating.

A mask is prepared on a glass plate to define the area of stripline 552 of diode 550. The layer 642 of metal is coated with a layer 632 of photoresist. Photoresist layer 632 is covered by a mask, and ultraviolet light is applied. The ultraviolet light exposes those regions of the photoresist not covered by the masking pattern. The resulting wafer is subjected to a chemical solution that removes the unexposed photosensitive material. A second solution etches away any metal not covered by the photoresist layer 632. The areas to the left of boundary 643 and to the right of boundary 644 are thus etched away. Thus, metal layer 642 ends at boundaries 643 and 644. As a next step, the photoresist layer 632 is removed by a second solution. The result of this masking and etching process is stripline 552.

In an alternative embodiment of the present invention, metal layer 642 that comprises stripline 552 is raised slightly above glass layer 624 in order to form an air bridge.

Next, wafer 602 is etched or sawed along lines 637 and 639 down to points 652 and 653. In this way glass and silicon is removed in order to form a mesa-like structure (also referred to as a mesa) that ultimately will become diode 550. A number of such mesas are formed on wafer 602 by etching or sawing.

Silicon wafer 602 of FIG. 14 is then sandblasted and etched from the back to remove the back silicon up to line 635. In other words, the depth of silicon indicated by length 655 in FIG. 14 is removed by sandblasting and etching. In an alternative embodiment of the present invention, wafer 602 can be backlapped. The result of sandblasting and etching (or backlapping) is that module 660 is formed, that has a bottom 635.

Through photomasking and etching, metal land areas are created under chips 572 and 564. In a preferred embodiment of the present invention, nickel-arsenic-gold is evaporated onto bottom 635 of module 660, creating an ohmic contact. The nickel-arsenic-gold is etched away from area 558 under glass 624, but not away from areas 572 and 564. Thus, the bottom of silicon layer 597 of chip 572 is metalized, and the bottom of silicon layer 597 of chip 564 is metalized.

Module 660 is then demounted and tested. Module 660 can be tested from the metalized bottoms of chips 572 and 564 defined by line 635.

According to an alternative method, module 660 can be tuned capacitively during fabrication by varying mesa size. According to an alternative method, module 660 can be tuned inductively during fabrication by varying the area of the metal overlay.

In another preferred embodiment of the present invention, multiple monolithic diodes can be used to form a bridge quad. FIG. 15 is a pictorial view of bridge quad 702. Bridge quad 702 is comprised of chips 710, 711, 712, and 713 surrounded on the sides by glass 720. Chips 710, 711, 712, and 713 are also referred to as blocks 710, 711, 712, and 713.

Chip 710 includes an anode 741 of a diode 771. Anode 741 resides in an upper region of chip 710. Diode 771 corresponds to diode 33 of prior art bridge quad configuration of FIG. 2.

Chip 710 of FIG. 15 also includes another anode 742 of a diode 772.

Anode 742 resides in an upper region of chip 710. Diode 772 corresponds to diode 39 of prior art bridge quad 31 of FIG. 2.

Chip 710 also includes cathode 781 common to both diode 771 and diode 772. A portion of cathode 781 resides in the lower region of chip 710. A metallic layer 810 is coupled to the bottom of cathode 781 of chip 710. The metallic layer 810 provides an electrical connection to external circuitry. The metalized bottom 810 of chip 710 corresponds to point 41 of prior art bridge quad configuration 31 of FIG. 2.

Chip 711 includes anode 743 of diode 773. Anode 743 resides in an upper region of chip 711. Diode 773 corresponds to diode 35 of prior art bridge quad configuration 31 of FIG. 2. Anode 743 resides in an upper region of chip 711.

Chip 711 also includes cathode 782. A portion of cathode 782 resides in an upper region of chip 711. A metallic layer 811 is coupled to the bottom of cathode 782. Metallic layer 811 provides an electrical connection to external circuitry. Metallic layer 811 corresponds to point 43 in prior art bridge quad configuration 31 of FIG. 2.

Chip 713 also includes anode 744 of diode 774. Anode 744 resides in an upper region of chip 713. Diode 774 corresponds to diode 37 of prior art bridge quad configuration 31 of FIG. 2.

Chip 713 includes a cathode 784. A portion of cathode 784 resides in a lower region of chip 713. Metallic layer 813 is coupled to the bottom of cathode 784 of chip 713. Metallic layer 813 provides an electrical connection to external circuitry. Metallic layer 813 corresponds to point 47 of prior art bridge quad configuration 31 of FIG. 2.

Chip 712 includes N+ type semiconductor layer 883 that provides a short between the upper region of chip 712 and the bottom of chip 712. The bottom of chip 712 is covered by a metallic layer 812. Metallic layer 812 provides an electrical connection to external circuitry. Metallic layer 812 corresponds to point 45 of prior art bridge quad 31 of FIG. 2.

Metal interconnecting structure 732 connects the N+ type semiconductor layer 883 of chip 712 with anode 744 of chip 713. Metal interconnecting structure 731 connects the N$^+$ semiconductor layer 883 of chip 712 with anode 743 of chip 711. Metal interconnecting structure 731 and 732 connect to the N+ semiconductor layer 883 via depression 751 of chip 712. The walls and floor of depression or well 751 are covered with metal that connects with and is part of metal interconnecting structures 731 and 732.

Metal interconnecting structure 730 couples the N+ semiconductor region 882 of chip 711 with anode 741. Metal interconnecting structure 730 contacts the N+ semiconductor layer 882 of chip 711 by way of depression 750. The walls and bottom of depression 750 are coated with metal, and that metal is connected and is part of metal interconnecting structure 730.

Metal interconnecting structure 733 connects the N+ semiconductor layer 884 of chip 713 with anode 742 of chip 710. Metal interconnecting structure 733 connects with the N+ semiconductor material 884 of chip 713 by way of depression 752. The inner walls and the bottom of depression 752 are coupled with metal that connects with and is part of metal interconnecting structure 733.

In a preferred embodiment of the present invention, the metal used in metal interconnecting structures 730, 731, 732, and 733 is titanium with a gold layer on the top. The gold layer inhibits the oxidation of the titanium. Metal interconnecting structures 730, 731, 732, and 733 are also referred to as striplines 730, 731, 732, and 733.

In a preferred embodiment of the present invention, diodes 771, 772, 773, and 774 are PIN diodes. In an alternative embodiment of the present invention, diodes 771, 772, 773, and 774 are NIP diodes. In yet another alternative embodiment of the present invention, diodes 771, 772, 773, and 774 are Schottky-barrier diodes.

FIG. 16 is a bottom view of bridge quad 702. Metallic pads 810, 811, 812, and 813 are the bottom metalized portions of chips 710, 711, 712, and 713, respectively. Glass 720 surrounds diode blocks 710, 711, 712, and 713.

As can be seen in FIG. 16, bridge quad 702 provides circuit connections 810, 811, 812, and 813 through the bottom of the four chips 710, 711, 712, and 713. Leads to other circuitry external to bridge quad 702 can be attached to pads 810, 811, 812, and 813 using either solder or conductive epoxy.

FIG. 17 is a cross-sectional side view of bridge quad 702 taken along line 17—17 of FIG. 15. As shown in FIG. 17, metal interconnecting structure 732 is coupled between well 751 of chip 712 and the anode 744 of chip 713. Anode 744 includes metallic region 800 and P+ region 861 of chip 713. The N− region 863 of chip 713 separates P+ region 861 from the N+ region 884. The N− region 863 is also referred to as the intrinsic I region. Cathode 784 includes metallic layer 813, N+ semiconductor region 884, and the metallic walls and bottom of well 752.

Chip 712 includes N+ semi-conductor region 883. Metallic layer 812 contacts the semiconductor region 883 (next page).

Cathode 783 includes metallized layer 812, the N+ semiconductor region 83, and the metallic walls and bottom of depression 751. As can be seen in FIG. 17, glass 720 surrounds chips 712 and 713. Glass 720 acts to hold chips 712 and 713 in place, and glass 720 forms the outer perimeter of bridge quad 702. In a preferred embodiment of the present invention, glass 720 is approximately 0.005 inches thick.

Bridge quad 702 provides thermal paths through relatively large volumes of silicon, thereby providing a relatively high power capability. Bridge quad 702 employs metalized bottoms 810, 811, 812, and 813 rather than beam leads for connection to external circuitry.

FIG. 18 is a top view of an entire package 900 for an integrated circuit. Package 900 is also referred to as electrical apparatus (or device) 900 that includes an integrated circuit. Package 900 includes package 901 and pads 920 through 933. Pads 920–933 provide electrical connection between the integrated circuit of package 901 and external circuitry (not shown). Metallic bridges 940 through 953 couple pads 920 through 933, respectively, to package 901. Connection pads 960 through 973 also provide connection to the integrated circuit of package 901, and pads 960 through 973 are located on the bottom of package 901.

Package 900 can be die-attached to external circuitry using solder or conductive epoxy.

Figure 19:
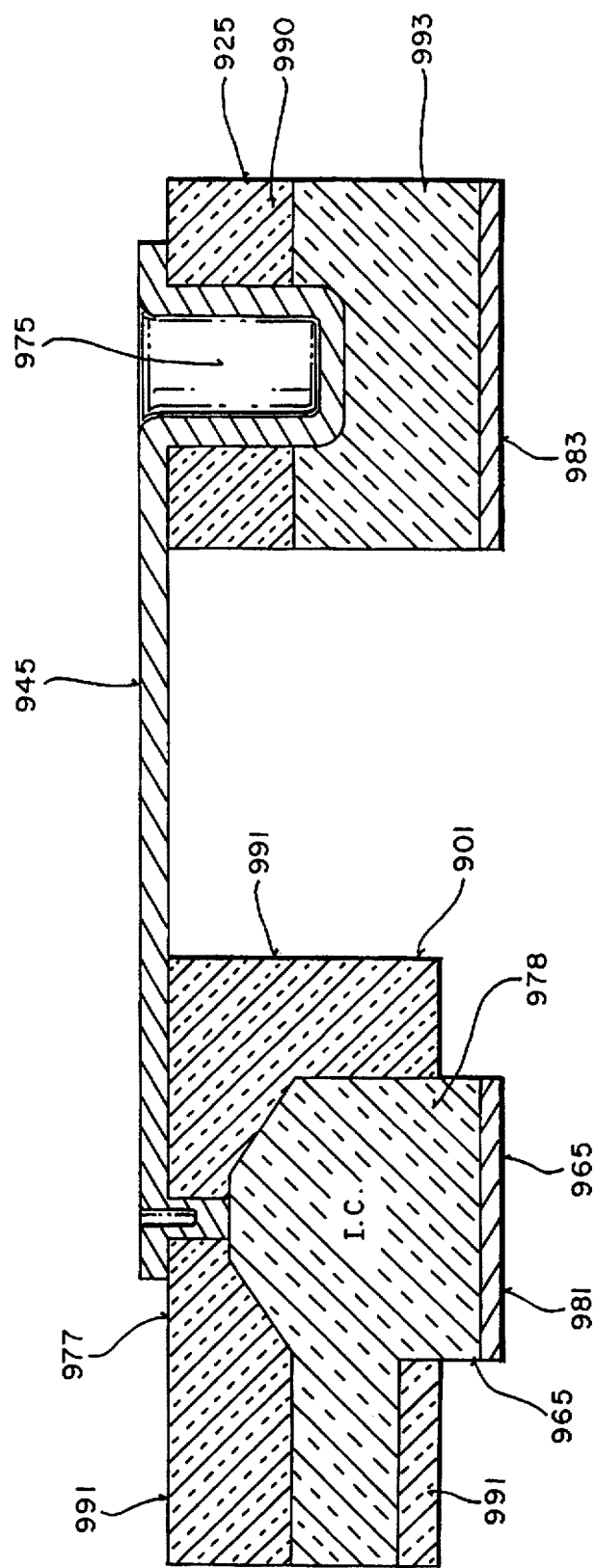
FIG. 19 is a side cross-sectional view of a portion of the integrated circuit package of FIG. 18.

FIG. 19 is a cross-sectional view of a portion of the integrated circuit package 900 taken along line 19—19 of FIG. 18. As shown in FIG. 19, package 901 includes integrated circuit 978. Integrated circuit 978 could include one or more transistors, diodes, or other circuit elements. Integrated circuit 978 could, for example, be comprised of complementary metal oxide semiconductor ("CMOS") devices, bipolar devices, or gallium arsenide devices.

Integrated circuit 978 is coupled to external circuitry via pad 965. Pad 965 includes a metallic layer 981. Metallic layer 981 can connect to external circuitry (not shown). In a preferred embodiment of the present invention, metallic layer 981 is made of nickel-arsenic-gold.

In a preferred embodiment of the present invention, integrated circuit 978 is packaged in glass 991. In an alternative embodiment, glass 991 provides a hermetic seal for integrated circuit 978.

Metal interconnecting structure 945 is coupled to pad 925 at connection location 977. Metal interconnecting structure 945 is also referred to as stripline 945.

Pad 925 includes connection well 975, glass 990, layer 993 of N+ type semiconductor material, and metallic layer 983. Pad 925 provides a connection to external circuitry (not shown) via metallic layer 983. Glass layer 990 holds metal interconnecting structure 945 and connection well 975 in place.

Connection location 977 is the location of connection between metal interconnecting structure 945 and integrated circuit 978. Connection well 975 is where metal interconnecting structure 945 connects to layer 993 of N+ type semiconductor material. Layer 993 in turn provides a straight connection path between the metal of connection well 975 and metallic layer 983. Metallic layer 983 can connect to external circuitry (not shown). In a preferred embodiment of the present invention, metallic layer 983 is made of nickel-arsenic-gold.

The pads 920–933 and 960–973 provide relatively large metal land areas that can be stressed relieved. The thermal energy of integrated circuit 978 can be conducted directly from integrated circuit 978 to external circuitry (not shown) via bottom 965 of package 901.

FIG. 20 illustrates a top view of ring quad 140, ring quad 140 being another preferred embodiment of the present invention. Ring quad 140 is comprised of diode blocks 142, 144, 146, and 148 surrounded on the sides by glass 180. Metal bridge lead 173 connects lead 165 and cathode 282 of diode 142 to anode 183 of diode 144. Metal bridge lead 175 connects lead 167 and cathode 284 of diode 144 to anode 185 of diode 146. Metal bridge lead 177 connects lead 169 and cathode 286 of diode 146 to anode 187 of diode 148. Metal bridge lead 179 connects lead 171 and cathode 288 of diode 148 to anode 181 of diode 142.

Diode blocks 142, 144, 146, and 148, glass 180, and interconnection leads 165, 173, 167, 175, 169, 177, 171, and 179 comprise module 182, also referred to as ring quad module 182.

Ring quad 140 can be used in a double-balanced mixer.

In contrast to prior art ring quad 50, solid package leads 141, 143, 145, and 147 of ring quad 140 are located underneath respective diode blocks 142, 144, 146, and 148 after leads 141, 143, 145, and 147 are attached (i.e., welded) to diode blocks 142, 144, 146, and 148.

Metal leads 141, 143, 145, and 147 are part of bottom lead package 159. Lead 141 rises above sector 157 of metal. Lead 143 rises above sector 151 of metal. Lead 145 rises above sector 153 of metal. Lead 147 rises above sector 155 of metal. Said sectors of metal are separated by two channels: channels 161 and 163. Beneath channels 161 and 163 lies epoxy or ceramic, which also underlies sectors 150, 151, 153, 155, and 157.

As illustrated in FIG. 20, lead 141 is soldered or epoxied to the bottom metalized portion of diode block 142. Lead 143 is soldered or epoxied to the bottom metalized portion of diode block 144. Lead 145 is soldered or epoxied to the bottom metalized portion of diode block 146. Lead 147 is soldered or epoxied to the bottom metalized portion of diode block 148.

In a preferred embodiment of the present invention, each of diodes 142, 144, 146 and 148 is a Schottky-barrier type diode.

FIG. 21 is a cross-sectional side view of ring quad 140 taken along line 21—21 of FIG. 20. As shown in FIG. 21, metal bridge 173 and lead 165 are part of the metal that connects cathode 221 to anode 183. Cathode 221 is comprised of an ohmic contact metal layer with a layer 222 of gold on the top. The metal can be titanium, for example. The gold layer 222 inhibits the oxidation of the contact metal of cathode 221. The metal of cathode 221 contacts from the top surface to layer 201 of the N+ type silicon by contacting down into a well or depression, as shown in FIG. 21.

Diode block 142 also includes an upper oxide layer 205, a middle layer 203 of N− type silicon, and a lower layer 201 of $N^+$ type silicon. Diode block 142 includes layer 172 of metal that provides a contact between layer 201 of $N^+$ type silicon and lead 141. The metal can be Nichrome-gold, for example.

Anode 183 includes layer 276 of Schottky-barrier metal that contacts layer 211 of $N^-$ type silicon. The Schottky-barrier metal can be titanium, for example. There thus is a metal-semiconductor junction between layer 276 of Schottky-barrier metal and layer 211 of $N^-$ type silicon.

Air bridge 215 is formed under metal bridge 173 to keep bridge 173 from contacting oxide layer 213. Air bridge 215 is also referred to as air gap 215.

As can be seen in FIG. 21, diode block 144 has an upper oxide layer 213, a middle $N^-$ type silicon layer 211, and a lower layer 209 of $N^+$ type silicon. Layer 174 is a layer of contact metal. The contact metal can be Nichrome-gold, for example. The contact metal layer 174 means that silicon block 144 is metalized on the bottom. This ensures good contact with lead 143.

Cathode 223 is comprised of an ohmic contact metal layer with a layer 224 of gold on the top. The metal can be titanium, for example. The gold layer 224 inhibits the oxidation of the contact metal of cathode 223. The metal of cathode 223 contacts from the top surface to layer 209 of the $N^+$ type silicon by contacting down into a well or depression, as shown in FIG. 21.

As can be seen from FIG. 21, glass 180 surrounds diode blocks 142 and 144, and acts to hold together diode blocks 142 and 144. Glass 180 forms the outer perimeter of module 182. In a preferred embodiment of the present invention, module 182 is approximately 2.5 to 3 mils thick. As shown in FIG. 21, glass 180 is as thick as the combined thickness of layers 205, 203, 201, and 172. It is to be understood, however, that in alternative embodiments of the present invention, glass 180 can have a different thickness. For example, glass 180 could be one-half as thick as the combined thickness of layers 205, 203, 201, and 172.

As shown in FIG. 21, lead 141 rises above metal sector 157 of lower lead package 159. Metal section 157 lies on top of ceramic or epoxy layer 160, which forms the lower layer of lower lead package 159.

Empty channel 161 lies underneath the central portion of glass 180.

Lead 143 rises above metal sector 151. Metal sector 151, in turn, lies on top of ceramic or epoxy layer 160.

FIG. 22 is a bottom view of module 182. The bottom metalized portions of diode blocks 142, 144, 146, and 148 are visible. Glass 180 surrounds diode blocks 142, 144, 146, and 148. Metal bridge 173, 175, 177, and 179 are on the other side of glass 180.

FIG. 23 illustrates the top view of lead package 159 without module 182. Leads 141, 143, 145, and 147 lie in respective sectors 157, 151, 153, and 155. Channels 161 and 163 crisscross bottom lead package 159.

FIG. 24 is bottom cross-sectional view of ring quad 140 taken along line 24—24 shown in FIG. 20. FIG. 24 shows leads 141, 143, 145, and 147 contacting module 182, but does not show the remainder of bottom lead package 159. Lead 141 is soldered or epoxied to the lower metalized portion of diode block 142. Lead 143 is soldered or epoxied to the lower metalized portion of diode block 144. Lead 145 is soldered or epoxied to the lower metalized portion of diode block 146. Lead 147 is soldered or epoxied to the lower metalized portion of diode block 148. Metal bridges 173, 175, 177, and 179 lie on the other side of glass 180.

FIG. 25 is a pictorial view of module 182 of ring quad 140. Bottom lead package 159 is not shown in FIG. 25. FIG. 25 shows that each diode block 142, 144, 146, and 148 has three principal layers. Diode block 142 has an oxide layer 205, an $N^-$ type silicon layer 203, and an $N^+$ type silicon layer 201. Diode block 142 also has a metalized layer 172 below layer 201. Diode block 144 has an upper oxide layer 213, a middle layer 211 comprised of $N^-$ type silicon, and a lower layer 209 comprised of $N^+$ type silicon. A metalized layer 174 coats the bottom of the $N^+$ type silicon layer 209. Diode block 146 has an upper oxide layer 261, a middle $N^-$ type silicon layer 259, and a lower layer 257 of $N^+$ type silicon. A metalized layer 274 coats the bottom portion of layer 257. Diode block 148 has an upper oxide layer 255, a middle layer 253 of $N^-$ type silicon and a lower layer 251 of $N^+$ type silicon. In addition, a metalized layer 272 lies below layer 251. Metalized layers 172, 174, 274, and 272 can be comprised of Nichrome-gold, for example, and act as ohmic contacts.

As can be seen in FIG. 25, metal bridge 173 connects lead 165 and cathode 282 to anode 183. Metal bridge 175 connects lead 167 and cathode 284 to anode 185 of diode 146. Metal bridge 177 connects lead 169 and cathode 286 of diode 146 with anode 187 of diode 148. Metal bridge 179 connects lead 171 and cathode 288 of diode 148 with anode 181 of diode 142.

Layer 292 comprised of Schottky-barrier metal is shown in FIG. 25 with respect to anode 185 of diode block 146. As can be seen in FIG. 25, the interconnections between the cathodes and anodes of diodes 142, 144, 146, and 148 lie on the top of module of 182. As noted with respect to FIG. 23, however, leads 141, 143, 145, and 147 connect to the bottoms of the diodes of of module 182 of ring quad 140. This means that power dissipates from top to bottom through diode chips 142, 144, 146, and 148. In other words, for ring quad 140 there are three degrees of freedom for power dissipation because energy spreads through the chips to leads 141, 143, 145, and 147 rather than merely across the chips in a horizontal direction. Stated another way, the energy dissipates vertically through the chips rather than horizontally across the chips. This results in good power dissipation characteristics for ring quad 140.

The lower-lead configuration of ring quad 140 also helps to avoid the destruction of the small cathode/anode topography from carbon trails from pulse transients. Destructive carbon trails are less likely on ring quad 140 given that external connections are made to the bottoms of diodes and that interconnections between cathodes and anodes are made on the tops of the diodes of ring quad 140.

Leads 165, 167, 169, and 171 each have a semicircular portion next to respective anodes 181, 183, 185, and 187. This allows the anode to be close to the cathode and at the same time helps to reduce the Faraday effects that result from sharp edges.

Ring quad 140 allows for smaller geometries and high wafer packaging density given that diode blocks 142, 144, 146, and 148 do not have flying leads. Instead leads 141, 143, 145, and 147 are in a secondary package assembly 159 (shown in FIG. 9). Therefore, diode blocks 142, 144, 146, and 148 can be smaller because they do not have flying leads on their tops. Smaller diode blocks mean small geometries—that is, more ring quads per silicon wafer.

Module 182 is not fragile given that glass 180 surrounds diode blocks 142, 144, 146, and 148 and can be as thick as said diode blocks, as shown in FIG. 25. Ring quad 140 is also less prone to beam lead bending given that leads 141, 143, 145, and 147 are an inherent part of bottom lead package 159 rather than on the top of module 182. In an alternative embodiment, glass 180 can be any thickness.

Ring quad 140 can be used as part of doubly double-balanced mixer. A doubly double-balanced mixer is comprised of eight diodes. A doubly double-balanced mixer can be formed by wiring together two ring quads. Such interconnection is known as a "double star" interconnection and is done in three-space with eight leads. Using two ring quads 140 in a doubly double balanced mixer simplifies the interconnection between the diodes because each ring quad 140 has leads on both the front and the back of diode blocks 142, 144, 146, and 148.

FIGS. 26 and 27 illustrate partially formed module 182 of ring quad 140 during the fabrication process. The fabrication process starts with a wafer of silicon with an N⁻ type layer on the top and an N⁺ type layer on the bottom. An oxide layer is first formed on top of the silicon wafer. The photolithography process is then used to form a plurality of wells by etching through the oxide and the N⁻ layer of the silicon to the N⁺ layer of the silicon for each well. In the photolithography process, a pattern or mask is used to decide which areas are to be etched and which areas are not to be etched. The wells that are etched are to be used for the cathodes of diode blocks 142, 144, 146, and 148. The wells are thus formed by a pit etch process. Next, the oxide and silicon layers are etched or sawed into a plurality of mesa-like structures (also referred to as mesas) that ultimately become the diode blocks.

Referring to FIG. 26, the silicon wafer used in the fabrication process is shown as wafer 301. Wafer 301 is approximately 10 to 12 mils thick, which the combined distance 325 and 321.

When the oxide and silicon is etched or sawed to form diode blocks 142, 144, 146, and 148, it reaches to a depth 325 as shown in FIG. 26. Depth 325 is approximately 2.5 to 3 mils. The saw or etchant penetrates to line 309 in FIG. 26. Channels 305, 306, and 307 are formed by an etch or sawing process. At this stage in the fabrication process, however, glass 180 has not yet been applied. After the sawing or etching occurs, each mesa or nascent diode block has a plurality of empty channels bordering that mesa, with silicon in the bottom of each channel. For example, mesa 331 in FIG. 26 is bordered by channels 305 and 306. Mesa 333 is bordered by channels 306 and 307. Given the channels 305, 306, and 307 only have a depth 325, it follows that the silicon of silicon wafer 301 underlies channels 305, 306, and 307.

Each mesa or nascent diode block is approximately 2.5 to 3 mils thick, which means that depth 325 is approximately 2.5 to 3 mils.

Each mesa has an upper oxide layer, a middle N⁻ type silicon layer, a lower N⁺ type silicon layer, and a well. For example, mesa 331 (i.e., nascent diode block 331) has an upper oxide layer 310, a middle N⁻ type silicon layer 312 and a lower N⁺ type silicon layer 314. Mesa 333 has an upper oxide layer 310, a middle N⁻ type silicon layer 312, and a lower N⁺ type silicon layer 314. Diode blocks 331 and 333 also each have a well formed by the photolithography process referred to above (the wells are not shown in. FIG. 26). In FIG. 26, well 491 is formed in mesa 442, well 493 is formed in mesa 444, well 495 is formed in mesa 446, and well 497 is formed in mesa 448.

The channels formed by etching or sawing are then filled with glass. Thus, channels 305, 306, and 307 shown in FIG. 26 are filled with glass 180.

A plurality of openings are then formed through the oxide layer to the N⁻ layer. The openings are for the anode contacts. Each mesa or nascent diode block gets one opening for the anode. The anode openings are formed by etching as part of the photolithography process. Each opening is a hole approximately 4 to 12 microns in diameter. In FIG. 27, anode opening 481 is formed in mesa 442, anode opening 483 is formed in mesa 444, anode opening 485 is formed in mesa 446, and anode opening 487 is formed in mesa 448.

Areas 421, 423, 425, and 427 of photoresist are applied to the top of the mesas and glass, as shown in FIG. 27. The areas of photoresist are used to form the air bridges described above, including air bridge 215 described with respect to FIG. 20.

A first layer of metal is deposited by metal deposition in a high-vacuum system to top 300 of wafer 301 of FIG. 26. A second layer of metal is then deposited by metal deposition in a high-vacuum system over the first layer of metal on top 300 of wafer 301 of FIG. 26. In a preferred embodiment of the present invention, the first layer of metal is titanium. The first layer of metal is also referred to as the contact metal. In a preferred embodiment of the present invention, the second layer of metal is gold. The layer of gold helps to inhibit or prevent the oxidation of the titanium.

The first layer of metal enters the cathode wells or depressions during deposition such that the first layer of metal contacts the N⁺ layer of silicon to form cathodes. The first layer of metal also enters the anode openings during deposition such that the first layer of metal contacts the N⁻ layer of silicon to form anodes. The first layer of metal in the anode openings acts as the metal for the metal-semiconductor junction for each of the anodes of mesas 442, 444, 446, and 448 of FIG. 27.

A plate or lead structure is then defined on top 300 of silicon wafer 301 of FIG. 26 by using masking and metal etching techniques common to the semiconductor industry. Metal plates or leads are so defined that metal plates or leads connect (1) anode 481 of mesa 442 shown in FIG. 27 to cathode 497 of mesa 448, (2) anode 483 of mesa 444 to cathode 491 of mesa 442, (3) anode 485 of mesa 446 to cathode 493 of mesa 444, and (4) anode 487 of mesa 448 to cathode 495 of mesa 446. It follows from the discussion above that said plates or leads are comprised of a lower first layer of metal and an upper second layer of metal. Again, in a preferred embodiment of the present invention, the first layer of metal is titanium, and the second layer of metal is gold.

The photoresist in areas 421, 423, 425, and 427 shown in FIG. 27 is then removed to form air bridges in areas 421, 423, 425, and 427 under the leads or plates connecting said anodes and cathodes. In an alternative embodiment of the invention, the photoresist is not removed. Rather, the photoresist is left in place to act as a photoresist bridge.

Central channels are then cut through selected ones of the glass-filled channels in order to form a module that includes four mesas or diode blocks forming a substantially square pattern. In FIG. 26, the central channel is cut through channels 305 and 307, but not through channel 306. Thus glass 180 remains to the left and right sides of channel 305 and to the left and right sides of 307. The result is that mesas 331 and 333 are surrounded by glass 180. As shown in FIG. 27, mesas 442, 444, 446 and 448 are surrounded by glass 480.

Referring to FIG. 26, silicon wafer 300 with mesas 331 and 333 is then sandblasted and etched from the back to remove the back silicon up to line 309. In other words, the depth of silicon indicated by length 321 in FIG. 26 is removed by sandblasting and etching. The sandblasting and etching ends once glass 180 is reached. In an alternative embodiment of the present invention, silicon wafer 300 can be back lapped.

Once the back silicon has been removed, then the bottom of module 329 is metalized. In other words, the area indicated by line 309 under module 329 is metalized.

In the preferred metalization process, Nichrome-gold is evaporated to the bottom of module 329, creating an ohmic contact. In other words, the Nichrome-gold is evaporated onto the area indicated on line 309 under module 29. The Nichrome-gold is then etched away from the glass 180 areas, but not away from the silicon areas 314. In other words, through photomasking and etching, metal land areas are created under area 314 for mesa 331 and area 314 for mesa 333 in order to isolate the silicon regions. Thus the bottom of the N$^+$ silicon layer of each mesa is metalized. Module 329 is then demounted and tested. Module 329 can be tested from the bottom, or, in other words, from the area indicated by line 309. Given that one can test from the bottom, testing from the top—using fragile top flying lead beams—is avoided.

In an alternative embodiments of the present invention Nichrome, nickel, and other metals could be used instead of titanium in the cathodes and anodes of the diode blocks.

In alternative embodiments of the present invention, the N$^-$ region of the diode blocks is referred to as the I region.

After module 329 has been formed and tested, it is then placed on top of bottom lead package 159 shown in FIG. 23 and is aligned as shown in FIGS. 20 and 24. In other words, leads 141, 143, 145, and 147 contact respective diode blocks 142, 144, 146, and 148. Module 329 (also referred to as module 182) and bottom lead package 159 are both embedded in black epoxy or attached to metalized ceramic to form a ring quad package. Said package is generally not fragile.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An electrical apparatus having a top and a bottom, comprising:

(a) a right side portion comprised of a first substrate, wherein the first substrate includes a top and a bottom, wherein the first substrate in the right side portion forms a direct conduction path between the top of the first substrate and the bottom of the first substrate;

(b) a left side portion comprising:
        (1) an integrated circuit that resides in an upper region of the left side portion, wherein the integrated circuit includes a top and a bottom; and
        (2) a second substrate that resides in a lower region of the left side portion, wherein the second substrate includes a region of the left side portion, wherein the second substrate includes a bottom and a top, wherein the top of the second substrate contacts the bottom of the integrated circuit;

(c) a middle region between the right side portion and the left side portion, wherein the middle region is comprised of an insulating material, wherein the insulating material in the middle region electrically isolates the right side portion from the left side portion;

(d) a metallic interconnecting structure that electrically couples the top of the first substrate of the right side portion of the top of the integrated circuit of the left side portion, wherein the metallic interconnecting structure extends over the insulating material of the middle portion and resides on the top of the electrical apparatus, wherein the metallic interconnecting structure includes a end and a second end, wherein the first end of the metallic interconnecting structure is coupled to the top of the first of the right side portion, wherein the second end of the metallic interconnecting structure is coupled to the top of the integrated circuit, wherein the metallic interconnecting structure does not directly physically contact external circuitry;

(e) a first metallic pad for a first connection to the external circuitry, wherein the first metallic pad is directly connected to the bottom of the first substrate of the right side portion, wherein the first metallic pad entirely resides on the bottom of the first substrate, and wherein the first metallic pad
        (1) is electrically connected to the top of the integrated circuit via the first substrate of the right side portion and the metallic interconnecting structure and
        (2) provides a first polarity coupling to the integrated circuit, wherein the first metallic pad includes a surface that contacts the external circuitry, wherein the external circuitry directly physically contacts the surface of the first metallic pad from directly beneath the surface of the first metallic pad in a substantially vertical arrangement with the first metallic pad, wherein the external circuitry is conductive circuitry, wherein the external circuitry is not part of the electrical apparatus and does not provide structural support for the electrical apparatus;

(f) a second metallic pad for a second connection to the external circuitry, wherein the second metallic pad is directly connected to the lower region of the second substrate of the left side portion, wherein the second metallic pad entirely resides on the bottom of the lower region of the second substrate, wherein the second metallic pad
        (1) is electrically connected to the bottom of the integrated circuit via the second substrate of the lower region of the left side portion and
        (2) provides a second polarity coupling to the integrated circuit, wherein the first metallic pad and the second metallic pad each resides on the bottom of the electrical apparatus, wherein the first and second metallic pads do not physically contact each other, wherein the second metallic pad does not extend beyond the bottom of the lower region of the second substrate of the left side portion, wherein the second metallic pad includes a surface that contacts the external circuitry, wherein the external circuitry directly physically contacts the surface of the second metallic pad from directly beneath the surface of the second metallic pad in a substantially vertical arrangement with the second metallic pad, wherein only the surface of the first and second metallic pads of the electrical apparatus directly physically contact the external circuitry, wherein the external circuitry does not electrically short the first and second metallic pads, wherein the first and second metallic pads do not directly physically contact the interconnecting structure.

2. The electrical apparatus of claim 1, wherein the first substrate and the second substrate are semiconductor material.

3. The electrical apparatus of claim 2, wherein the semiconductor material of the first substrate is N+ type silicon, and wherein the semiconductor material of the second substrate is N+ type silicon.

4. The electrical apparatus of claim 1, wherein the integrated circuit comprises a PIN diode.

5. The electrical apparatus of claim 1, wherein the integrated circuit comprises a Schottky-barrier diode.

6. The electrical apparatus of claim 1, wherein the integrated circuit comprises a complex integrated circuit having a plurality of electrical connections.

7. The electrical apparatus of claim 1, wherein the insulating layer is a glass insulating layer.

8. An electrical apparatus having a top and a bottom, comprising:
   (a) a right side portion comprised of a substrate, wherein the substrate of the right side portion includes a top and a bottom, wherein the substrate in the right side portion forms a direct conduction path between the top of the substrate and the bottom of the substrate;
   (b) a left side portion comprising:
      (1) an integrated circuit having a top and a bottom; and
      (2) an insulating layer for packaging the integrated circuit, wherein the left side portion is electrically isolated from the right side portion;
   (c) a metallic interconnecting structure that electrically couples the top of the right side portion to the top of the integrated circuit of the left side portion, wherein the metallic interconnecting structure resides on the top of the electrical apparatus, wherein the metallic interconnecting structure includes a first end and a second end, wherein the first end of the metallic interconnecting structure is coupled to the top of the right side portion, wherein the second end of the metallic interconnecting structure is coupled to the top of the integrated circuit, wherein the metallic interconnecting structure does not directly physically contact external circuitry;
   (d) a first metallic pad for a first connection to the external circuitry, wherein the first metallic pad is directly connected to the bottom of the right side portion, wherein the first metallic pad entirely resides on the bottom of the right side portion, and wherein the first metallic pad
      (1) is electrically connected to the top of the integrated circuit via the first substrate of the right side portion and the metallic interconnecting structure and
      (2) provides a first polarity coupling to the integrated circuit, wherein the first metallic pad does not extend beyond the bottom of the substrate of the right side portion, wherein the first metallic pad includes a surface that contacts the external circuitry, wherein the external circuitry directly physically contacts the surface of the first metallic pad from directly beneath the surface of the first metallic pad in a substantially vertical arrangement with the first metallic pad, wherein the external circuitry is conductive circuitry that performs a predetermined electrical function, wherein the external circuitry is not part of the electrical apparatus and does not provide structural support for the electrical apparatus;
   (e) a substantially planar second metallic pad for a second connection to the external circuitry, wherein the second metallic pad is directly connected to the integrated circuit of the left side portion, wherein the second metallic pad entirely resides on the bottom of the integrated circuit, wherein the second metallic pad
      (1) is electrically connected to the bottom of the integrated circuit and
      (2) provides a second polarity coupling to the integrated circuit, wherein the first and second metallic pads each resides on the bottom of the electrical apparatus, wherein the first and second metallic pads do not physically contact each other, wherein the second metallic pad does not extend beyond the bottom of the integrated circuit of the left side portion, wherein the second metallic pad includes a surface that contacts the external circuitry, wherein the external circuitry directly physically contacts the surface of the second metallic pad from directly beneath the surface of the second metallic pad in a substantially vertical arrangement with the second metallic pad, wherein only the surface of the first and second metallic pads of the electrical apparatus directly physically contact the external circuitry, wherein the external circuitry does not electrically short the first and second metallic pads, wherein the first and second metallic pads do not directly physically contact the interconnecting structure.

9. The electrical apparatus of claim 8, wherein the substrate is a semiconductor substrate.

10. The electrical apparatus of claim 9, wherein the substrate of the right side portion is N+ type silicon.

11. The electrical apparatus of claim 8, wherein the integrated circuit comprises a PIN diode.

12. The electrical apparatus of claim 8, wherein the integrated circuit comprises a Schottky-barrier diode.

13. The electrical apparatus of claim 8, wherein the integrated circuit comprises a complex integrated circuit having a plurality of electrical connections.

14. The electrical apparatus of claim 8, wherein the insulating layer is glass.

15. The electrical apparatus of claim 8, wherein the integrated circuit includes a transistor.

* * * * *